United States Patent
Negoro et al.

(10) Patent No.: US 12,426,435 B2
(45) Date of Patent: Sep. 23, 2025

(54) IMAGING DEVICE

(71) Applicant: Semiconductor Energy Laboratory Co., Ltd., Atsugi (JP)

(72) Inventors: Yusuke Negoro, Kaizuka (JP); Seiichi Yoneda, Isehara (JP); Hiroki Inoue, Atsugi (JP); Shunsuke Sato, Yokohama (JP); Shunpei Yamazaki, Setagaya (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 495 days.

(21) Appl. No.: 17/795,260

(22) PCT Filed: Feb. 3, 2021

(86) PCT No.: PCT/IB2021/050845
§ 371 (c)(1),
(2) Date: Jul. 26, 2022

(87) PCT Pub. No.: WO2021/161134
PCT Pub. Date: Aug. 19, 2021

(65) Prior Publication Data
US 2023/0144505 A1    May 11, 2023

(30) Foreign Application Priority Data
Feb. 14, 2020   (JP) .................. 2020-023387

(51) Int. Cl.
*H10K 39/32*   (2023.01)
*H04N 23/20*   (2023.01)
(Continued)

(52) U.S. Cl.
CPC ............. *H10K 39/32* (2023.02); *H04N 23/20* (2023.01); *H04N 23/951* (2023.01);
(Continued)

(58) Field of Classification Search
CPC ........ H10K 39/32; H10K 30/85; H10K 30/86; H10K 39/38; H10K 39/401; H10K 39/601; H10D 80/30; H10D 88/00; H10D 30/6734
See application file for complete search history.

(56) References Cited

U.S. PATENT DOCUMENTS

| 8,450,728 B2 | 5/2013 | Yamaguchi |
| 8,878,267 B2 | 11/2014 | Inui |

(Continued)

FOREIGN PATENT DOCUMENTS

| CN | 109075179 A | 12/2018 |
| EP | 1970959 A | 9/2008 |

(Continued)

OTHER PUBLICATIONS

International Search Report (Application No. PCT/IB2021/050845) Dated May 18, 2021.

(Continued)

*Primary Examiner* — Earl N Taylor
(74) *Attorney, Agent, or Firm* — Eric J. Robinson; Robinson Intellectual Property Law Office, P.C.

(57) ABSTRACT

A multifunctional imaging device is provided. The imaging device includes first to fourth light-receiving elements and first and second functional layers. The first to fourth light-receiving elements are photoelectric conversion elements having sensitivity to light of different wavelengths from each other. The first and second functional layers each include first and second transistors. The first functional layer and the fourth to first light-receiving elements are stacked in this order over the second functional layer. In each of the first to fourth light-receiving elements, a first conductive layer, a first buffer layer, a photoelectric conversion layer, a second buffer layer, and a second conductive layer are stacked in this order. The photoelectric conversion layer (Continued)

includes an organic compound, and the first buffer layer and the second buffer layer each include a metal or an organic compound. The first transistor is electrically connected to the first conductive layer of any of the first to fourth light-receiving elements. The second transistor is electrically connected to the first transistor.

12 Claims, 25 Drawing Sheets

(51) Int. Cl.
*H04N 23/951* (2023.01)
*H10D 30/67* (2025.01)
*H10D 80/30* (2025.01)
*H10D 88/00* (2025.01)
*H10K 30/85* (2023.01)
*H10K 30/86* (2023.01)
*H10K 39/00* (2023.01)
*H10K 39/38* (2023.01)

(52) U.S. Cl.
CPC ............ *H10D 80/30* (2025.01); *H10D 88/00* (2025.01); *H10K 30/85* (2023.02); *H10K 30/86* (2023.02); *H10K 39/38* (2023.02); *H10K 39/401* (2023.02); *H10K 39/601* (2023.02); *H10D 30/6734* (2025.01)

(56) References Cited

U.S. PATENT DOCUMENTS

| | | | |
|---|---|---|---|
| 9,905,657 | B2 | 2/2018 | Endo. et al. |
| 10,170,565 | B2 | 1/2019 | Yoneda |
| 10,256,348 | B2 | 4/2019 | Endo. et al. |
| 10,651,222 | B2 | 5/2020 | Kato et al. |
| 10,805,562 | B2 | 10/2020 | Nakamura et al. |
| 11,411,034 | B2 | 8/2022 | Kato et al. |
| 11,863,728 | B2 | 1/2024 | Akimoto et al. |
| 11,888,012 | B2 | 1/2024 | Murata et al. |
| 12,041,800 | B2 | 7/2024 | Kanemura et al. |
| 2007/0018075 | A1 | 1/2007 | Cazaux et al. |
| 2008/0230123 | A1 | 9/2008 | Mitsui. et al. |
| 2014/0054577 | A1 | 2/2014 | Mitsui. et al. |
| 2015/0287766 | A1 | 10/2015 | Kim et al. |
| 2016/0316159 | A1 | 10/2016 | Yoneda |
| 2017/0207347 | A1 | 7/2017 | Endo. et al. |
| 2019/0088693 | A1 | 3/2019 | Kato et al. |
| 2021/0084249 | A1 | 3/2021 | Nakazawa et al. |
| 2022/0069025 | A1* | 3/2022 | Yamazaki .............. H05B 45/20 |
| 2024/0145517 | A1 | 5/2024 | Murata et al. |

FOREIGN PATENT DOCUMENTS

| | | | |
|---|---|---|---|
| EP | 2750191 | A | 7/2014 |
| EP | 3734660 | A | 11/2020 |
| EP | 3828934 | A | 6/2021 |
| JP | 2006-245284 | A | 9/2006 |
| JP | 2007-228460 | A | 9/2007 |
| JP | 2008-227091 | A | 9/2008 |
| JP | 2011-119711 | A | 6/2011 |
| JP | 2011-138927 | A | 7/2011 |
| JP | 2011-243704 | A | 12/2011 |
| JP | 2012-015400 | A | 1/2012 |
| JP | 2012-191222 | A | 10/2012 |
| JP | 2015-032687 | A | 2/2015 |
| JP | 2015-095517 | A | 5/2015 |
| JP | 2016-208515 | A | 12/2016 |
| JP | 2016-213298 | A | 12/2016 |
| JP | 2017-060003 | A | 3/2017 |
| JP | 2017-130661 | A | 7/2017 |
| JP | 2017-174936 | A | 9/2017 |
| JP | 2017-183992 | A | 10/2017 |
| KR | 2015-0118885 | A | 10/2015 |
| KR | 2017-0141685 | A | 12/2017 |
| KR | 2018-0124023 | A | 11/2018 |
| TW | 200803484 | | 1/2008 |
| TW | 201644265 | | 12/2016 |
| TW | 201931584 | | 8/2019 |
| WO | WO-2007/105478 | | 9/2007 |
| WO | WO-2012/001939 | | 1/2012 |
| WO | WO-2015/016140 | | 2/2015 |
| WO | WO-2016/002576 | | 1/2016 |
| WO | WO-2016/170442 | | 10/2016 |
| WO | WO-2017/014025 | | 1/2017 |
| WO | WO-2017/163559 | | 9/2017 |
| WO | WO-2019/130702 | | 7/2019 |
| WO | WO-2019/131965 | | 7/2019 |
| WO | WO-2020/022462 | | 1/2020 |
| WO | WO-2021/099889 | | 5/2021 |

OTHER PUBLICATIONS

Written Opinion (Application No. PCT/IB2021/050845) Dated May 18, 2021.
Chen.C et al., "Learning to See in the Dark", arXiv.org: Computer Vision and Pattern Recognition (cs.CV), May 4, 2018, pp. 1-10, Cornell University.

* cited by examiner

FIG. 23A1
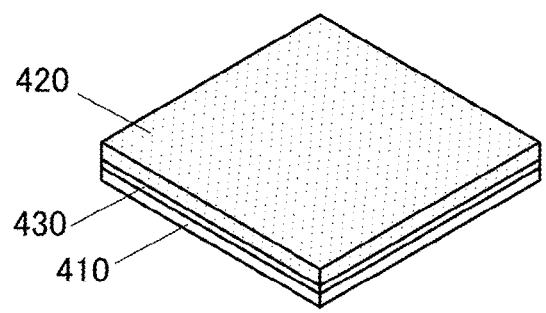
FIG. 23B1
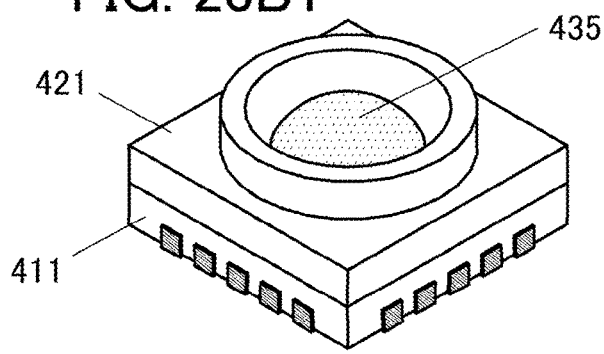
FIG. 23A2
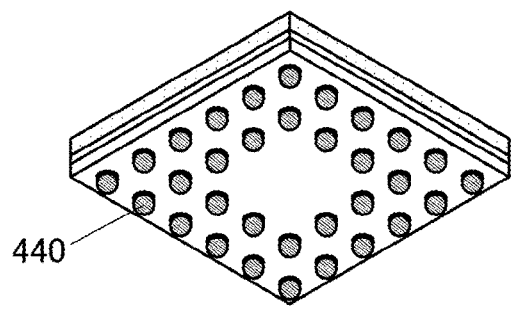
FIG. 23B2
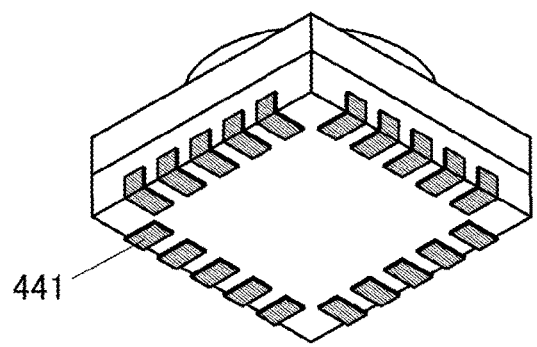
FIG. 23A3
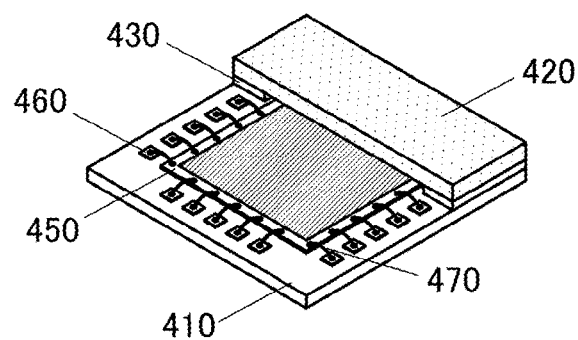
FIG. 23B3
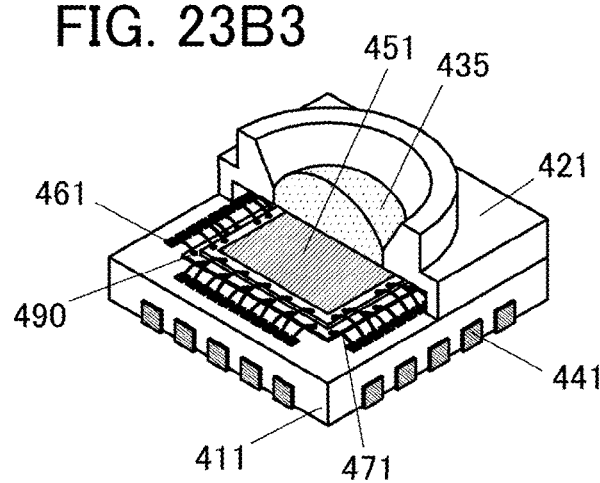

IMAGING DEVICE

TECHNICAL FIELD

One embodiment of the present invention relates to an imaging device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof. A semiconductor device generally means a device that can function by utilizing semiconductor characteristics.

BACKGROUND ART

A technique for forming a transistor by using an oxide semiconductor thin film formed over a substrate has attracted attention. For example, an imaging device with a structure in which a transistor that includes an oxide semiconductor and has an extremely low off-state current is used in a pixel circuit is disclosed in Patent Document 1.

REFERENCE

Patent Document

[Patent Document 1] Japanese Published Patent Application No. 2011-119711

SUMMARY OF THE INVENTION

Problems to be Solved by the Invention

In a pixel of a solid-state imaging device such as a CMOS image sensor, subpixels for obtaining data of incident light that is separated into components of three primary colors (red (R), green (G), and blue (B)) are provided. Color image data can be generated by the subpixels. In general, many subpixels for obtaining data of G with a high luminosity factor are provided in order to obtain luminance data accurately. For example, a structure is employed in which one pixel includes four subpixels of R·G·G·B arrangement.

The components of R, G, and B can be separated from each other using color filters. Furthermore, when a filter that cuts light having a higher energy than infrared light is used, infrared-light (IR) data can also be obtained. In order to obtain a color image and an infrared light image at the same time, a subpixel for infrared light is needed in addition to subpixels for colors.

Accordingly, the structure of subpixels is R·G·G·B·IR arrangement or R·G·B·IR arrangement. The former includes five subpixels and thus the number of total pixels is decreased and the definition is decreased as compared to an image sensor of the same size having R·G·G·B arrangement. The latter includes the same number of pixels but has an inferior function of obtaining luminance data in a similar comparison.

An object of one embodiment of the present invention is to provide an imaging device capable of capturing a high-definition color image. An object of one embodiment of the present invention is to provide an imaging device capable of capturing a high-definition color image and a high-definition infrared light image. An object of one embodiment of the present invention is to provide an imaging device that can easily achieve a higher resolution. An object of one embodiment of the present invention is to provide an imaging device that can easily achieve a higher aperture ratio. An object of one embodiment of the present invention is to provide a multifunctional imaging device.

Another object of one embodiment of the present invention is to provide a highly reliable imaging device. An object of one embodiment of the present invention is to provide an imaging device that has a novel structure. An object of one embodiment of the present invention is to provide a semiconductor device, an electronic device, or the like that has a novel structure. An object of one embodiment of the present invention is to at least reduce at least one of problems of the conventional technique.

Note that the description of these objects does not preclude the existence of other objects. One embodiment of the present invention does not have to achieve all of these objects. Objects other than these can be derived from the description of the specification, the drawings, the claims, and the like.

Means for Solving the Problems

One embodiment of the present invention is an imaging device including a first light-receiving element, a second light-receiving element, a third light-receiving element, a fourth light-receiving element, a first functional layer, and a second functional layer. The first light-receiving element is a photoelectric conversion element having sensitivity to light of a first wavelength. The second light-receiving element is a photoelectric conversion element having sensitivity to light of a second wavelength. The third light-receiving element is a photoelectric conversion element having sensitivity to light of a third wavelength. The fourth light-receiving element is a photoelectric conversion element having sensitivity to light of a fourth wavelength. The first functional layer includes a first transistor. The second functional layer includes a second transistor. The first functional layer, the fourth light-receiving element, the third light-receiving element, the second light-receiving element, and the first light-receiving element are stacked in this order over the second functional layer. Each of the first light-receiving element, the second light-receiving element, the third light-receiving element, and the fourth light-receiving element has a stacked-layer structure in which a first conductive layer, a first buffer layer, a photoelectric conversion layer, a second buffer layer, and a second conductive layer are stacked in this order. The photoelectric conversion layer includes an organic compound, and each of the first buffer layer and the second buffer layer includes a metal or an organic compound. The first transistor is electrically connected to the first conductive layer included in any one of the first light-receiving element, the second light-receiving element, the third light-receiving element, and the fourth light-receiving element. The second transistor is electrically connected to the first transistor.

Another embodiment of the present invention is an imaging device including a first light-receiving element, a second light-receiving element, a third light-receiving element, a fourth light-receiving element, a first functional layer, and a second functional layer. The first light-receiving element is a photoelectric conversion element having sensitivity to light of a first wavelength. The second light-receiving element is a photoelectric conversion element having sensitivity to light of a second wavelength. The third light-receiving element is a photoelectric conversion element having sensitivity to light of a third wavelength. The fourth light-receiving element is a photoelectric conversion element having sensitivity to light of a fourth wavelength. The first functional layer includes a first transistor. The second functional layer includes a second transistor. The first functional layer, the fourth light-receiving element, the third light-receiving element, the second light-receiving element, and the first light-receiving element are stacked in this order over the second functional layer. Each of the first light-receiving element, the second light-receiving element, and the third light-receiving element has a stacked-layer structure in which a first conductive layer, a first buffer layer, a photoelectric conversion layer, a second buffer layer, and a second conductive layer are stacked in this order. The photoelectric conversion layer includes an organic compound, and each of the first buffer layer and the second buffer layer includes a metal or an organic compound. The fourth light-receiving element is provided on a first single crystal substrate and includes a photoelectric conversion portion having a pn junction in the first single crystal substrate. The first transistor is electrically connected to the first conductive layer included in any one of the first light-receiving element, the second light-receiving element, and the third light-receiving element. The second transistor is electrically connected to the first transistor.

In the above, the first transistor is preferably provided on the first single crystal substrate and includes a channel formation region in the first single crystal substrate.

In any of the above, the first transistor preferably includes silicon in a channel formation region. Alternatively, the first transistor preferably includes an oxide semiconductor in a channel formation region.

In any of the above, the second transistor is preferably provided on the first single crystal substrate and includes a channel formation region in the first single crystal substrate.

In the above, a third functional layer is preferably included between the first functional layer and the second functional layer, the third functional layer preferably includes a third transistor, and the third transistor preferably includes an oxide semiconductor in a channel formation region.

In any of the above, a plug is preferably included. In this case, the plug electrically connects one of a source and a drain of the first transistor and the first conductive layer included in the first light-receiving element to each other. The photoelectric conversion layer included in the second light-receiving element preferably includes a first opening portion. Furthermore, the second conductive layer included in the second light-receiving element preferably includes a second opening portion. In this case, the plug preferably includes a portion that is in contact with the photoelectric conversion layer in the first opening portion. Furthermore, the plug preferably includes a portion positioned inside the second opening portion and is in contact with neither the first conductive layer nor the second conductive layer.

In any of the above, a plug is preferably included. In this case, it is preferable that the plug electrically connect one of a source and a drain of the first transistor and the first conductive layer included in the first light-receiving element to each other. Furthermore, the photoelectric conversion layer included in the second light-receiving element preferably includes a first opening portion. The second conductive layer included in the second light-receiving element preferably includes a second opening portion. Furthermore, the plug preferably includes a portion positioned inside the first opening portion and a portion positioned inside the second opening portion and is preferably in contact with neither the first conductive layer, the photoelectric conversion layer, nor the second conductive layer.

In any of the above, any three of the light of the first wavelength, the light of the second wavelength, the light of the third wavelength, and the light of the fourth wavelength are preferably visible light and the other is preferably infrared light or ultraviolet light.

In any of the above, wavelengths are preferably shorter in the order of the first wavelength, the second wavelength, the third wavelength, and the fourth wavelength.

Effect of the Invention

With one embodiment of the present invention, an imaging device capable of capturing a high-definition color image can be provided. Alternatively, an imaging device capable of capturing a high-definition color image and a high-definition infrared light image can be provided. Alternatively, an imaging device that can easily achieve a higher resolution can be provided. Alternatively, an imaging device that can easily achieve a higher aperture ratio can be provided. Alternatively, a multifunctional imaging device can be provided.

Alternatively, with one embodiment of the present invention, a highly reliable imaging device can be provided. Alternatively, an imaging device that has a novel structure can be provided. Alternatively, a semiconductor device, an electronic device, or the like that has a novel structure can be provided. Alternatively, at least one of problems of the conventional technique can be at least reduced.

Note that the description of these effects does not preclude the existence of other effects. One embodiment of the present invention does not have to have all of these effects. Effects other than these can be derived from the description of the specification, the drawings, the claims, and the like.

BRIEF DESCRIPTION OF THE DRAWINGS

FIG. 23A1 to FIG. 23A3 and FIG. 23B1 to FIG. 23B3 are perspective views of a package in which an imaging device is placed and a module in which an imaging device is placed.

MODE FOR CARRYING OUT THE INVENTION

Figure 1:
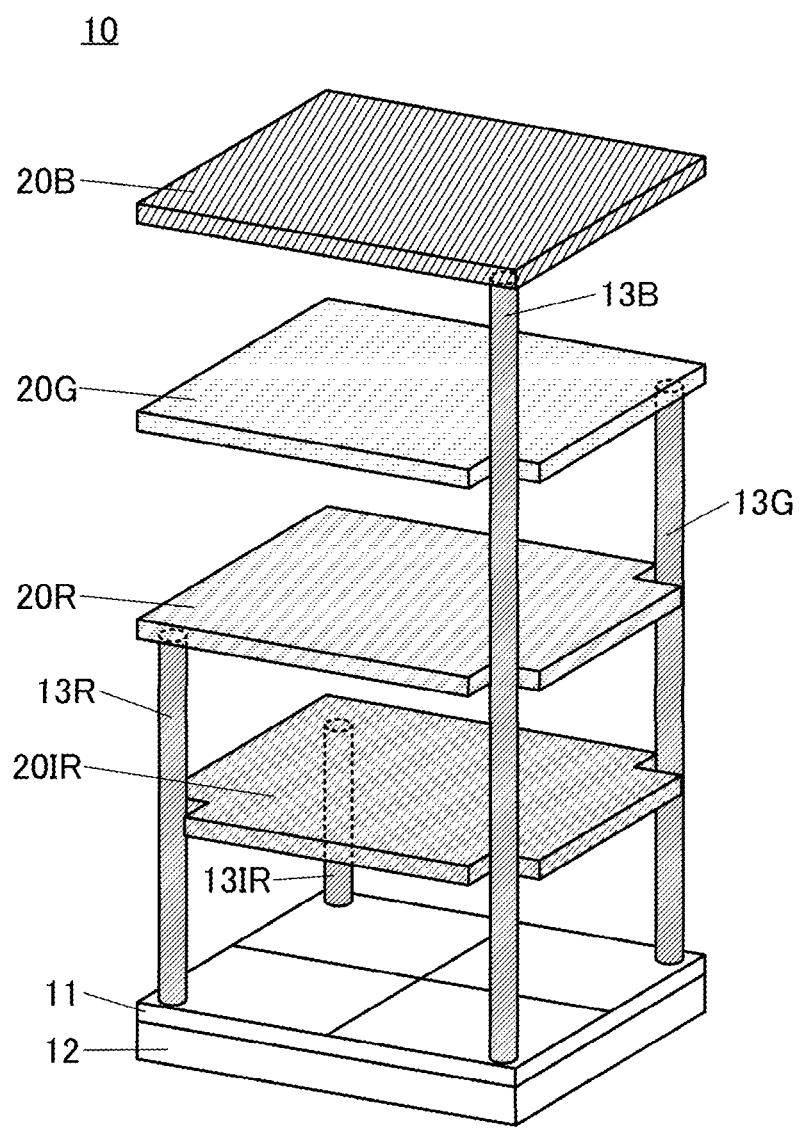
FIG. 1 is a diagram illustrating a structure example of an imaging device.

Hereinafter, embodiments are described with reference to the drawings. Note that the embodiments can be implemented in many different modes, and it is readily understood by those skilled in the art that modes and details thereof can be changed in various ways without departing from the spirit and scope thereof. Thus, the present invention should not be construed as being limited to the following description of the embodiments.

Note that in structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, they are not limited to the illustrated scale.

Note that in this specification and the like, the ordinal numbers such as "first" and "second" are used in order to avoid confusion among components and do not limit the number.

A transistor is a kind of semiconductor element and can carry out a function of amplifying a current or a voltage, a switching operation for controlling conduction or non-conduction, and the like. An IGFET (Insulated Gate Field Effect Transistor) and a thin film transistor (TFT) are in the category of a transistor in this specification.

Functions of a "source" and a "drain" are sometimes replaced with each other when a transistor of opposite polarity is used or when the direction of a current is changed in circuit operation, for example. Therefore, the terms "source" and "drain" can be switched with each other in this specification.

In this specification and the like, "electrically connected" includes the case where connection is made through an "object having any electric function". Here, there is no particular limitation on the "object having any electric function" as long as electric signals can be transmitted and received between components that are connected through the object. Examples of the "object having any electric function" include a switching element such as a transistor, a resistor, a coil, a capacitor, and other elements with a variety of functions as well as an electrode and a wiring.

Note that the expressions indicating directions such as "over" and "under" are basically used to correspond to the directions of drawings. However, in some cases, the direction indicating "over" or "under" in the specification does not correspond to the direction in the drawings for the purpose of description simplicity or the like. For example, when a stacking order (or formation order) of a stacked body or the like is described, even in the case where a surface on which the stacked body is provided (e.g., a formation surface, a support surface, an adhesion surface, or a planar surface) is positioned above the stacked body in the drawings, the direction and the opposite direction are referred to as "under" and "over", respectively, in some cases.

Embodiment 1

In this embodiment, an imaging device of one embodiment of the present invention will be described.

One embodiment of the present invention is an imaging device including a plurality of light-receiving elements, a first functional layer, and a second functional layer. The first functional layer and the second functional layer each include one or more transistors. The plurality of light-receiving elements are photoelectric conversion elements having sensitivity to light of different wavelengths from each other. In one embodiment of the present invention, the first functional layer is stacked over the second functional layer, and the plurality of light-receiving elements are further stacked over the first functional layer.

The plurality of light-receiving elements have a function of absorbing light of different wavelengths and converting the light into electric signals. Among the plurality of light-receiving elements, the light-receiving element positioned on the uppermost side (the image capturing side or the light incident side) (also referred to as a first light-receiving element) absorbs light in a wavelength range including a first wavelength and transmits light in the other wavelength range. Furthermore, the light-receiving element positioned next to the first light-receiving element from the top (also referred to as a second light-receiving element) absorbs light in a wavelength range including a second wavelength out of the light having passed through the first light-receiving element and transmits light in the other wavelength range. Among the plurality of light-receiving elements, the light-receiving element positioned on the lowermost side absorbs light in a wavelength range including a predetermined wavelength out of the light having passed through one or more light-receiving elements positioned on the upper side (e.g., the first light-receiving element and the second light-receiving element). The plurality of light-receiving elements stacked in this manner can absorb light of different wavelengths from each other and convert the light into electric signals.

In the imaging device of one embodiment of the present invention, the plurality of light-receiving elements can be stacked, which can increase the light-receiving area per light-receiving element as compared with the case where the plurality of light-receiving elements are placed side by side. Accordingly, the sensitivity of the light-receiving elements can be increased. Moreover, the area of each pixel can be reduced as compared with the case where the plurality of light-receiving elements are placed side by side, enabling a high resolution without lowering the sensitivity.

The first functional layer includes a transistor included in a pixel circuit. The transistor (also referred to as a first transistor) included in the first functional layer is electrically connected to one of the plurality of light-receiving elements stacked thereover. A transistor (also referred to as a second transistor) included in the second functional layer positioned under the first functional layer may be electrically connected to the first transistor or may be electrically connected to a wiring provided in the first functional layer. The second functional layer may include another transistor included in the pixel circuit.

The first functional layer may be provided with a variety of circuits other than the pixel circuit. For example, a driver circuit for driving pixels, a read circuit for reading data from pixels, a protective circuit, a memory circuit, and the like can be provided.

A variety of circuits such as a driver circuit, a read circuit, a protective circuit, a memory circuit, an arithmetic circuit, a power supply circuit, and a signal generation circuit can be provided in the second functional layer. A circuit may be formed by elements (components) such as a transistor, a capacitor, a resistor, and a wiring included in the first functional layer and such elements (components) included in the second functional layer. When the first functional layer and the second functional layer are stacked, a downsized and multifunctional imaging device can be achieved.

In particular, a driver circuit for driving the pixel circuit is preferably provided in the second functional layer. When the driver circuit is provided so as to overlap with the pixel circuit and the light-receiving elements, a wiring between the driver circuit and the pixel circuit can be made extremely short as compared with the case where these are placed side by side. Thus, influences of signal delay and a decrease in signal level can be suppressed.

Furthermore, the second functional layer is preferably provided with a memory circuit and an arithmetic circuit. Image data captured by each pixel circuit can be subjected to image processing with the memory circuit and the arithmetic circuit and output. In that case, the arithmetic circuit included in the second functional layer preferably includes a product-sum operation circuit. Accordingly, machine learning, especially image processing with the use of a neural network, can be executed.

The plurality of functional layers and the plurality of light-receiving elements are stacked in this manner, whereby the imaging device can have high sensitivity, high definition, multiple functions, or small size.

More specific structure examples are described below with reference to drawings.

Structure Example of Pixel

FIG. 1 illustrates a schematic perspective view of a portion corresponding to a pixel of an imaging device 10. The imaging device 10 includes a light-receiving element 20B, a light-receiving element 20G, a light-receiving element 20R, a light-receiving element 20IR, a functional layer 11, and a functional layer 12. The functional layer 11 is provided to be stacked over the functional layer 12. The light-receiving element 20IR, the light-receiving element 20R, the light-receiving element 20G, and the light-receiving element 20B are stacked over the functional layer 11 in this order. Among the plurality of light-receiving elements, the light-receiving element 20B is positioned in the uppermost layer, and the light-receiving element 20B side corresponds to the image capturing surface side (the light incident side).

The functional layer 11 is electrically connected to each of the light-receiving elements by plugs. In FIG. 1, a plug 13IR electrically connecting the light-receiving element 20IR and the functional layer 11 to each other, a plug 13R electrically connecting the light-receiving element 20R and the functional layer 11 to each other, a plug 13G electrically connecting the light-receiving element 20G and the functional layer 11 to each other, and a plug 13B electrically connecting the light-receiving element 20B and the functional layer 11 to each other are provided.

Here, the plug 13R electrically connects the functional layer 11 and the light-receiving element 20R to each other through a layer in which the light-receiving element 20IR is provided. Thus, the plug 13R and the light-receiving element 20IR are provided so as to be isolated from each other in order to avoid an electrical short circuit therebetween.

Similarly, the plug 13G is provided so as to be isolated from the light-receiving element 20IR and the light-receiving element 20R, which are positioned between the light-receiving element 20G and the functional layer 11. Furthermore, the plug 13B is provided so as to be isolated from the light-receiving element 20IR, the light-receiving element 20R, and the light-receiving element 20G, which are positioned between the light-receiving element 20B and the functional layer 11.

Note that, for example, as long as the plug 13R and the light-receiving element 20IR do not cause an electrical short circuit therebetween, some of a plurality of layers included in the light-receiving element 20IR may be in contact with the plug 13R. Similarly, the plug 13G and the plug 13B may be in contact with part of the light-receiving elements.

Figure 2:
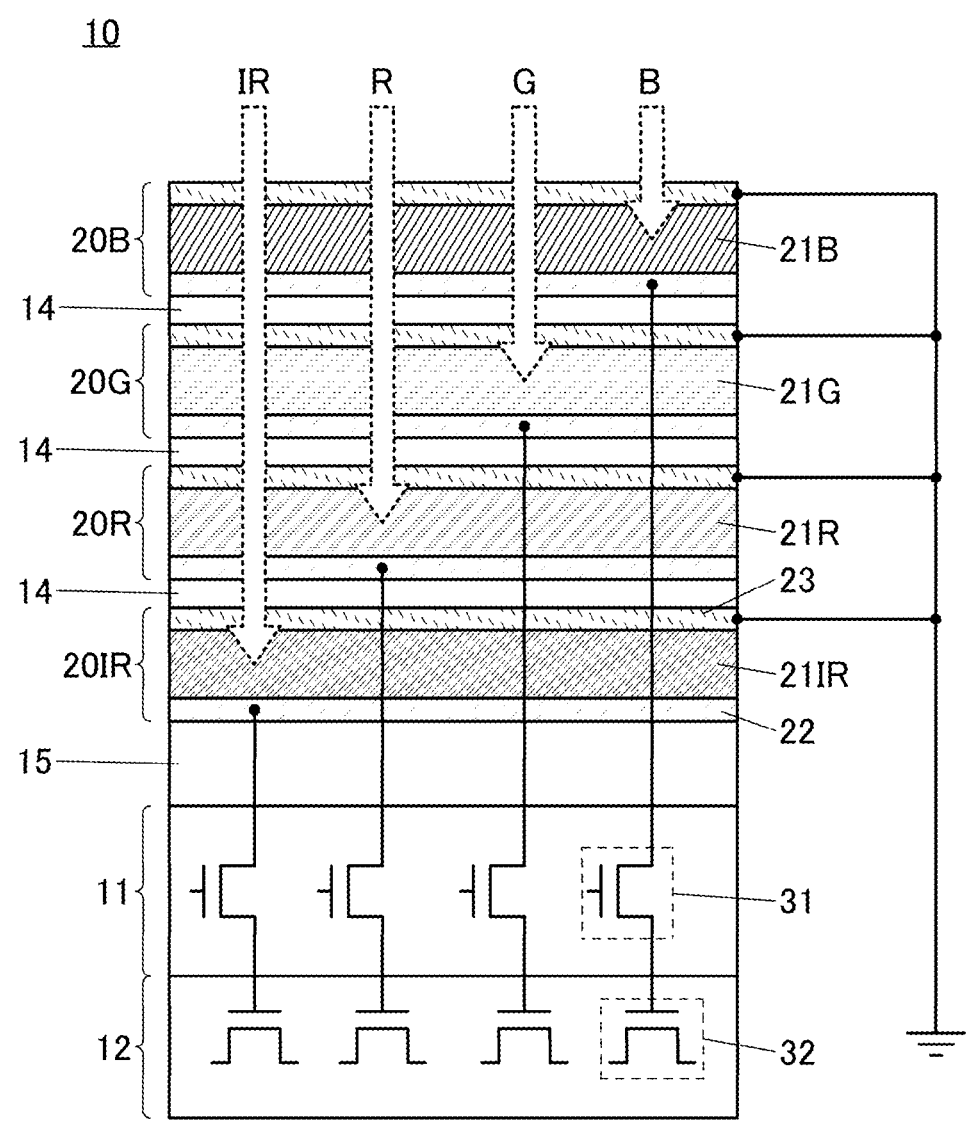
FIG. 2 is a diagram illustrating a structure example of the imaging device.

FIG. 2 is a schematic cross-sectional view for describing one pixel of the imaging device.

In the imaging device 10 illustrated in FIG. 2, the functional layer 12, the functional layer 11, the light-receiving element 20IR, the light-receiving element 20R, the light-receiving element 20G, and the light-receiving element 20B are stacked in this order. Between two of the light-receiving elements, an insulating layer 14 having a light-transmitting property is provided. Between the functional layer 11 and the light-receiving element 20IR, an insulating layer 15 is provided.

Each of the light-receiving elements includes a conductive layer 22, a conductive layer 23, and a photoelectric conversion layer therebetween. A photoelectric conversion layer 21B included in the light-receiving element 20B has sensitivity to blue light (B). A photoelectric conversion layer 21G included in the light-receiving element 20G has sensitivity to green light (G). A photoelectric conversion layer 21R included in the light-receiving element 20R has sensitivity to red light (R). A photoelectric conversion layer 21IR included in the light-receiving element 20IR has sensitivity to infrared light (IR). The conductive layer 22 and the conductive layer 23 have a light-transmitting property. For the conductive layer 22 of the light-receiving element 20IR positioned closest to the functional layer 11 side, a light-blocking conductive material may be used. Especially when a conductive material having a light-reflecting property is used, light having passed through the photoelectric conversion layer 21IR can be reflected, whereby conversion efficiency (also referred to as external quantum efficiency) of the light-receiving elements can be increased.

The functional layer 11 is provided with a plurality of transistors 31. The transistor 31 is electrically connected to the conductive layer 22 included in any one of the light-receiving element 20IR, the light-receiving element 20R, the light-receiving element 20G, and the light-receiving element 20B. Here, an example in which the conductive layer 22 and one of a source and a drain of the transistor 31 are electrically connected to each other is illustrated. Moreover, a common potential (a ground potential here) is supplied to the conductive layer 23 of each of the light-receiving elements. Note that different potentials may be supplied to the conductive layers 23 of the light-receiving elements.

The functional layer 12 is provided with a plurality of transistors 32. The transistor 32 is electrically connected to the transistor 31 included in the functional layer 11; a wiring, an electrode, or a terminal; or the like. FIG. 2 illustrates an example in which a gate of the transistor 32 is electrically connected to the other of the source and the drain of the transistor 31.

The transistor 32 included in the functional layer 12 is preferably provided in a single crystal substrate. For example, a transistor whose channel is formed in part of a single crystal substrate can be favorably used. Alternatively, a transistor whose channel is formed in a semiconductor thin film formed on a single crystal substrate may be used. As the single crystal substrate, a silicon substrate can be typically used. As the single crystal substrate, a semiconductor substrate other than a silicon substrate, such as a silicon carbide substrate, a gallium nitride substrate, or an oxide semiconductor substrate, may be used.

Each of the photoelectric conversion layers included in the light-receiving elements preferably absorbs light in a wavelength range including a predetermined wavelength. In this way, the light-receiving elements can be used as light cut filters. In the example illustrated in FIG. 2, blue light (B) is absorbed by the light-receiving element 20B. Green light (G) passes through the light-receiving element 20B and is absorbed by the light-receiving element 20G. Red light (R) passes through the light-receiving element 20B and the light-receiving element 20G and is absorbed by the light-receiving element 20R. Infrared light (IR) passes through the light-receiving element 20B, the light-receiving element 20G, and the light-receiving element 20R and is absorbed by the light-receiving element 20IR.

In the example illustrated in FIG. 2, the light-receiving elements having sensitivity to light of shorter wavelengths are stacked in order from the light incident side. Since light of a short wavelength is more easily scattered or absorbed than light of a long wavelength, placing the light-receiving elements that receive light of shorter wavelengths closer to the light incident side, the influence of light attenuation can be reduced and a highly sensitive imaging device can be achieved.

Note that the stacking order of the light-receiving elements is not limited to the structure illustrated in FIG. 1 and FIG. 2. The stacking order can be changed as appropriate depending on properties of the light-receiving elements. For example, it is preferable that the light-receiving element which absorbs light in a narrower wavelength range be placed closer to the light incident side and that the light-receiving element which absorbs light in a wider wavelength range be placed closer to the side opposite to the incident side. Each drawing in FIG. 3 illustrates an example of the other stacking orders.

Figure 3A:
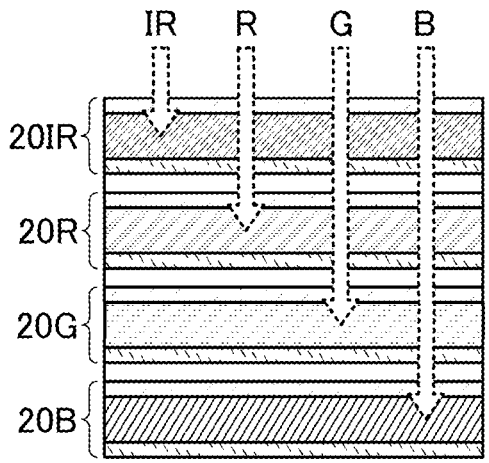
FIG. 3A to FIG. 3F are diagrams illustrating structure examples of the imaging device.

FIG. 3A illustrates an example in which the light-receiving element which receives light of a longer wavelength is placed closer to the light incident side. Specifically, the light-receiving element 20IR, the light-receiving element 20R, the light-receiving element 20G, and the light-receiving element 20B are stacked in this order from the light incident side.

Figure 3B:
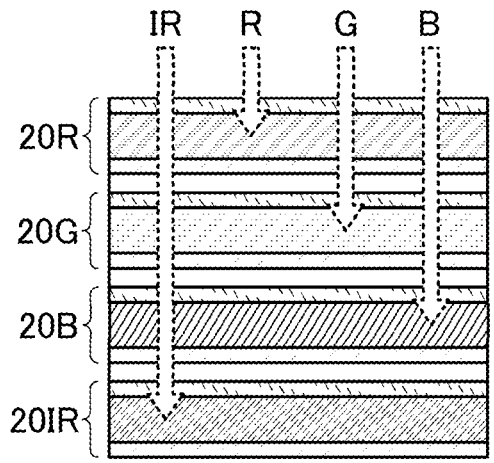

FIG. 3B illustrates an example of the case where the light-receiving element 20R, the light-receiving element 20G, the light-receiving element 20B, and the light-receiving element 20IR are stacked in this order from the light incident side.

Figure 3C:
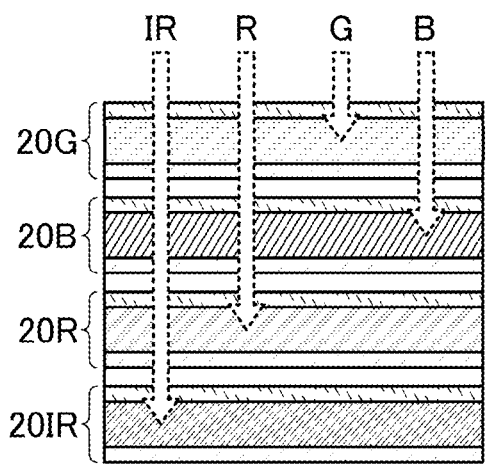
Figure 3D:
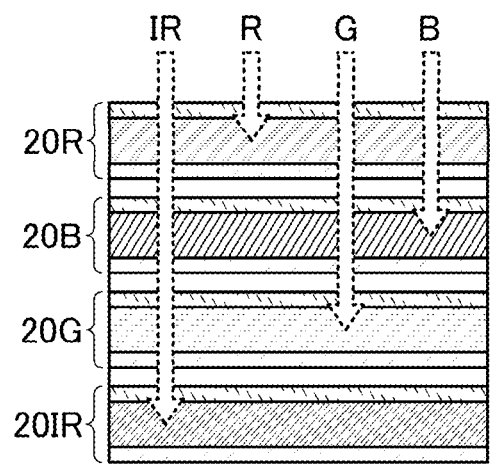

FIG. 3C illustrates an example of the case where the light-receiving element 20G, the light-receiving element 20B, the light-receiving element 20R, and the light-receiving element 20IR are stacked in this order from the light incident side. FIG. 3D illustrates an example of the case where the light-receiving element 20R, the light-receiving element 20B, the light-receiving element 20G, and the light-receiving element 20IR are stacked in this order from the light incident side.

Figure 3E:
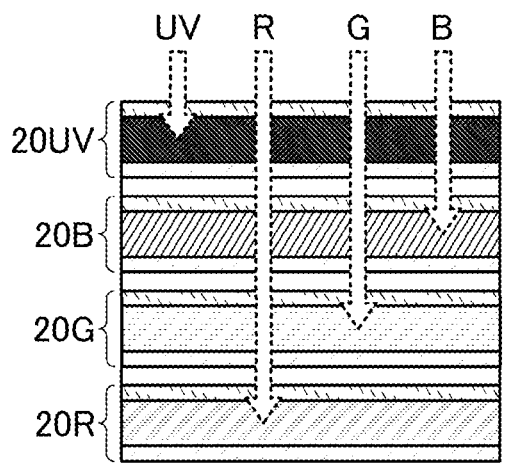
Figure 3F:
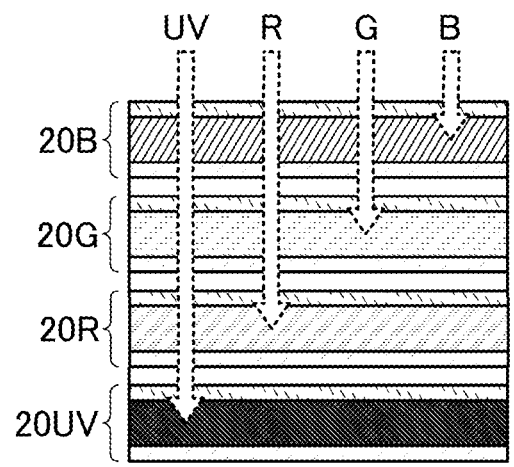

FIG. 3E and FIG. 3F illustrate examples of the case of using a light-receiving element 20UV which receives ultraviolet light (UV) instead of the light-receiving element 20IR which receives infrared light (IR).

FIG. 3E illustrates an example of the case where the light-receiving element 20UV, the light-receiving element 20B, the light-receiving element 20G, and the light-receiving element 20R are stacked in this order from the light incident side. FIG. 3F illustrates an example of the case where the light-receiving element 20B, the light-receiving element 20G, the light-receiving element 20R, and the light-receiving element 20UV are stacked in this order from the light incident side.

Figure 4:
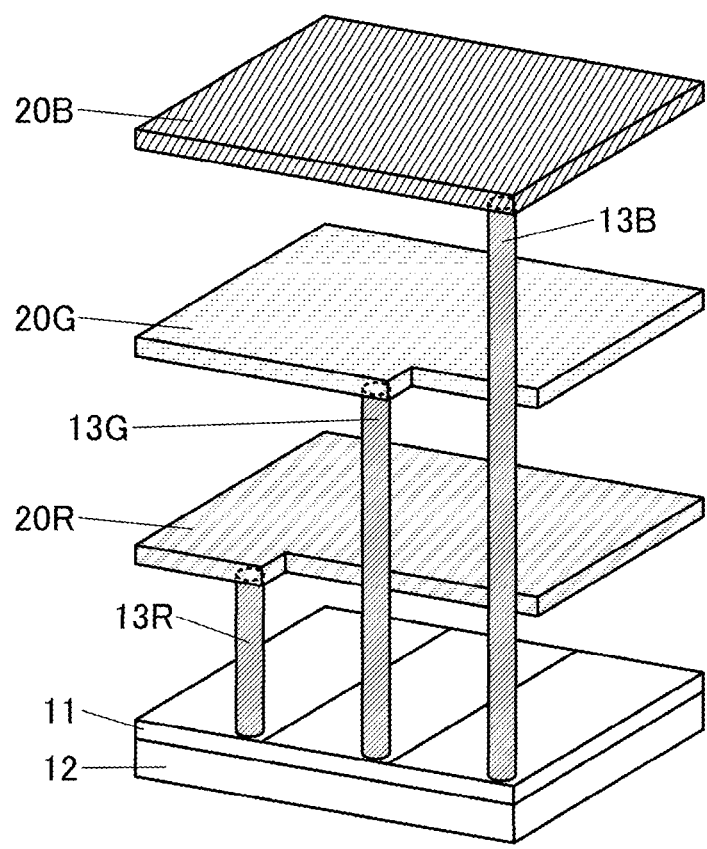
FIG. 4 is a diagram illustrating a structure example of the imaging device.

Note that although examples in which four kinds of light-receiving elements are stacked are described here, without limitation thereto, a structure in which three kinds of light-receiving elements are stacked may be employed, or five or more kinds of light-receiving elements may be stacked. Furthermore, a stacked-layer structure including two or more light-receiving elements of the same kind may be employed. FIG. 4 illustrates an example of the case where three kinds of light-receiving elements, which are the light-receiving element 20B, the light-receiving element 20G, and the light-receiving element 20R, are stacked.

Figure 5:
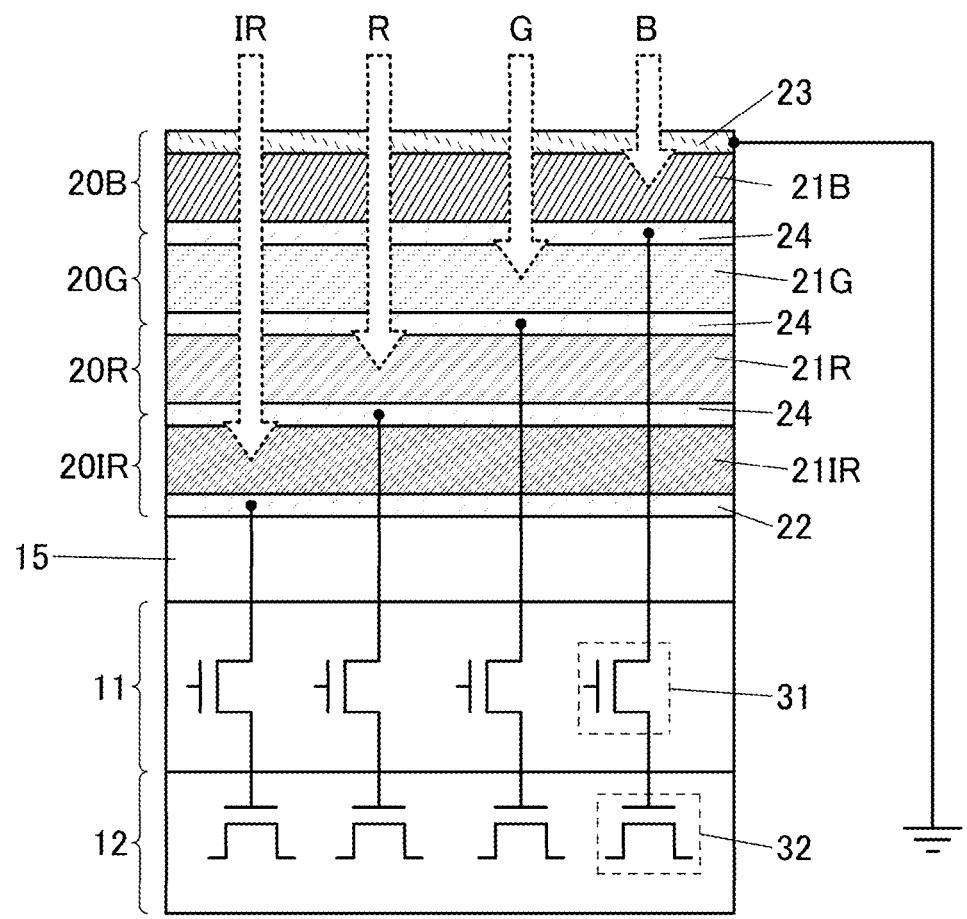
FIG. 5 is a diagram illustrating a structure example of the imaging device.

FIG. 5 is a schematic cross-sectional view of the imaging device 10 which is partly different from the above-described imaging device.

FIG. 5 illustrates an example in which the insulating layers 14 are not provided between the light-receiving elements. The four light-receiving elements (20B, 20G, 20R, and 20IR) are connected in series. Furthermore, the electrodes are shared by the two adjacent light-receiving elements.

Specifically, the photoelectric conversion layer 21IR and the photoelectric conversion layer 21R are stacked with a conductive layer 24 therebetween over the conductive layer 22. The conductive layer 24 serves both the function of the upper electrode of the light-receiving element 20IR and the function of the lower electrode of the light-receiving element 20R. Similarly, the photoelectric conversion layer 21R and the photoelectric conversion layer 21G are stacked with the conductive layer 24 therebetween. Furthermore, the photoelectric conversion layer 21G and the photoelectric conversion layer 21B are stacked with the conductive layer 24 therebetween. The conductive layer 23 is included over the photoelectric conversion layer 21B. The conductive layer 22 and the conductive layers 24 are electrically connected to different transistors 31 from each other. Furthermore, a ground potential is supplied to the conductive layer 23.

In the example illustrated in FIG. 5, potentials of the four conductive layers (the conductive layer 22 and the three conductive layers 24) are obtained and differences therebetween are calculated, so that signals corresponding to the intensities of light received by the light-receiving elements can be obtained.

Structure Example of Light-Receiving Element

A more specific structure example of the light-receiving element is described below. Here, description is given taking, as an example, the light-receiving element (the light-receiving element 20IR) positioned on the lowermost side among the four light-receiving elements illustrated as an example in FIG. 1.

Figure 6A:
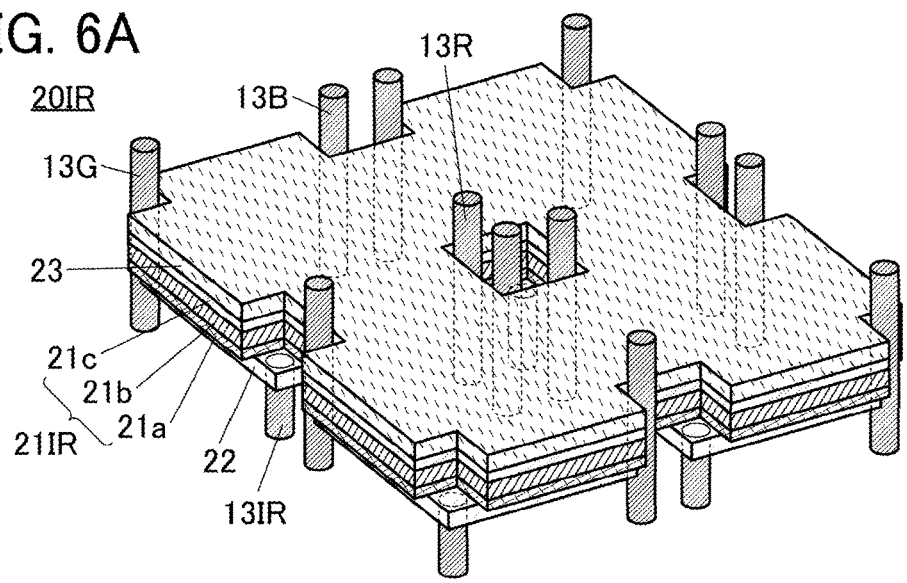
FIG. 6A and FIG. 6B are diagrams illustrating a structure example of a light-receiving element.
Figure 6B:
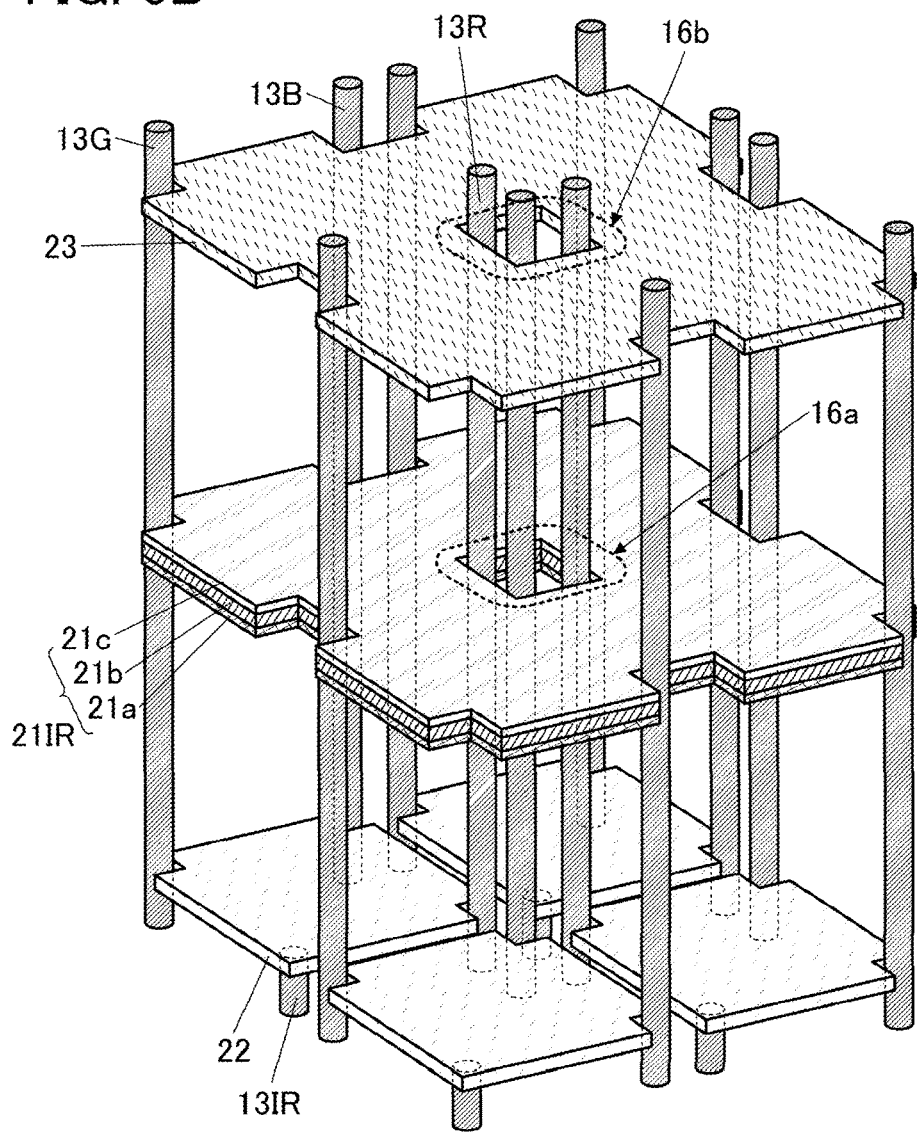

FIG. 6A illustrates a schematic perspective view of the light-receiving element 20IR for 2×2 pixels. FIG. 6B illustrates a schematic perspective view of layers in FIG. 6A developed up and down.

As illustrated in FIG. 6B, the conductive layer 22 has an island shape. Since the region for four pixels is illustrated here, four island-shaped conductive layers 22 are illustrated in FIG. 6B. The plug 13IR is electrically connected to the conductive layer 22. The conductive layer 22 has a shape provided with notch portions on three sides so as not to be in contact with the plug 13B, the plug 13G, and the plug 13R. Thus, the light-receiving area of the light-receiving element can be made as large as possible.

The photoelectric conversion layer 21IR has a stacked-layer structure in which a buffer layer 21a, an active layer 21b, and a buffer layer 21c are stacked. The buffer layer 21a and the buffer layer 21c each function as a carrier-transfer layer. The active layer 21b has a function of generating electric charge by the photoelectric effect. The buffer layer 21a, the active layer 21b, and the buffer layer 21c each preferably include an organic compound. Furthermore, the photoelectric conversion layer 21IR is provided so as to be continuous between the adjacent pixels.

The photoelectric conversion layer 21IR includes an opening portion 16a so as not to be in contact with the plug 13B, the plug 13G, and the plug 13R. In FIG. 6B, three plugs are positioned in the opening portion 16a.

The conductive layer 23 has the same top surface shape as the photoelectric conversion layer 21IR. In other words, the conductive layer 23 and the photoelectric conversion layer 21IR can be processed using the same photomask or the like. The conductive layer 23 is provided so as to be continuous between the adjacent pixels.

The conductive layer 23 includes an opening portion 16b so as not to be in contact with the plug 13B, the plug 13G, and the plug 13R. In FIG. 6B, three plugs are positioned in the opening portion 16b.

Figure 7A:
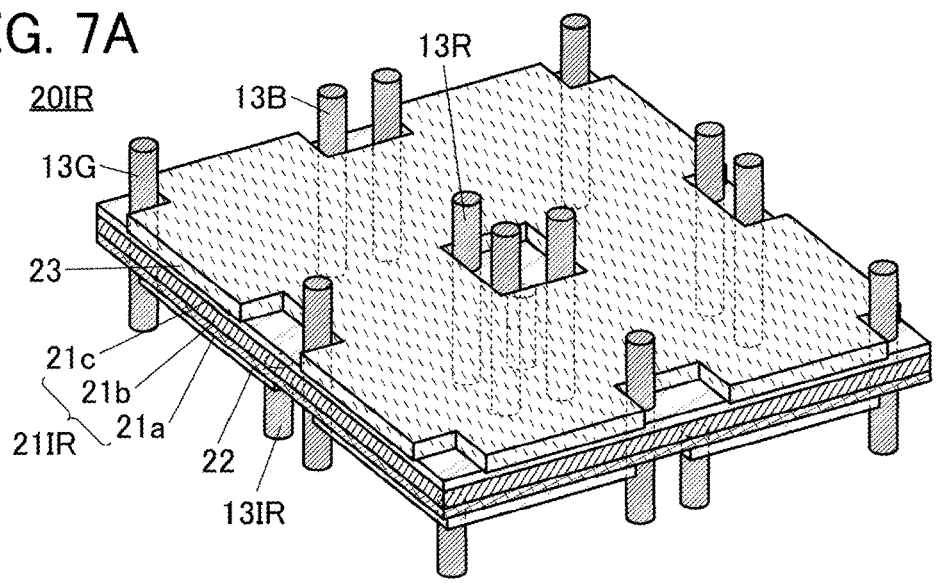
FIG. 7A and FIG. 7B are diagrams illustrating a structure example of the light-receiving element.
Figure 7B:
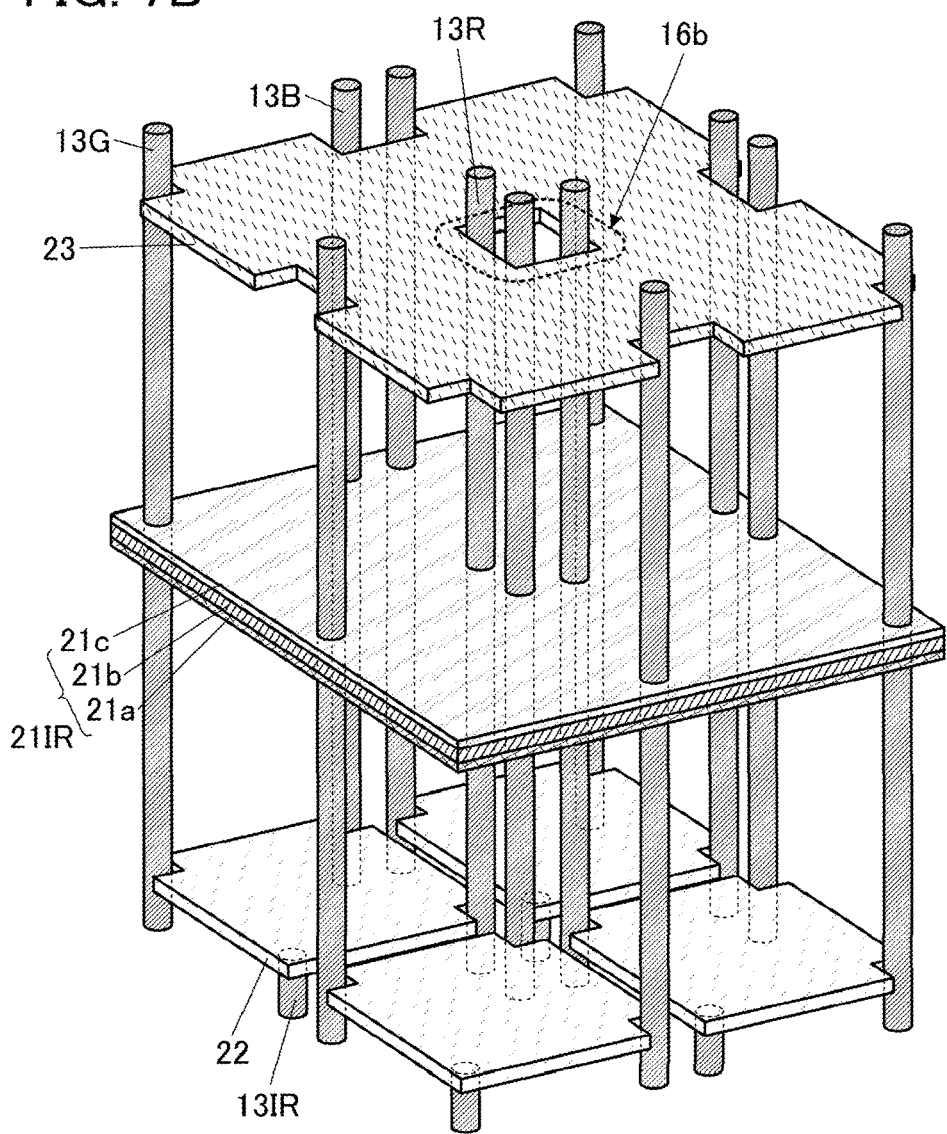

FIG. 7A and FIG. 7B illustrate an example of the case where the photoelectric conversion layer 21IR and each of the plugs are in contact with each other.

In the case where the buffer layer 21a, the active layer 21b, and the buffer layer 21c included in the photoelectric conversion layer 21IR are formed using materials having low electric conductivity, a problem might not be caused even when the photoelectric conversion layer 21IR and the plugs are provided to be in contact with each other as illustrated in FIG. 7A and FIG. 7B. This structure can simplify the process. Note that in the case where each of the layers included in the photoelectric conversion layer 21IR includes a material having high electric conductivity, an electrical short circuit might be caused between the plugs and thus the structure illustrated in FIG. 6A and the like is preferred.

Structure Example 1 of Imaging Device

A structure example of the imaging device is described below.

Note that components such as insulating layers and conductive layers that are described below are examples, and the imaging device may include another component. Furthermore, some components described below may be omitted. A stacked-layer structure described below can be formed using a bonding process, a polishing process, or the like as necessary.

Structure Example 1-1

Figure 8:
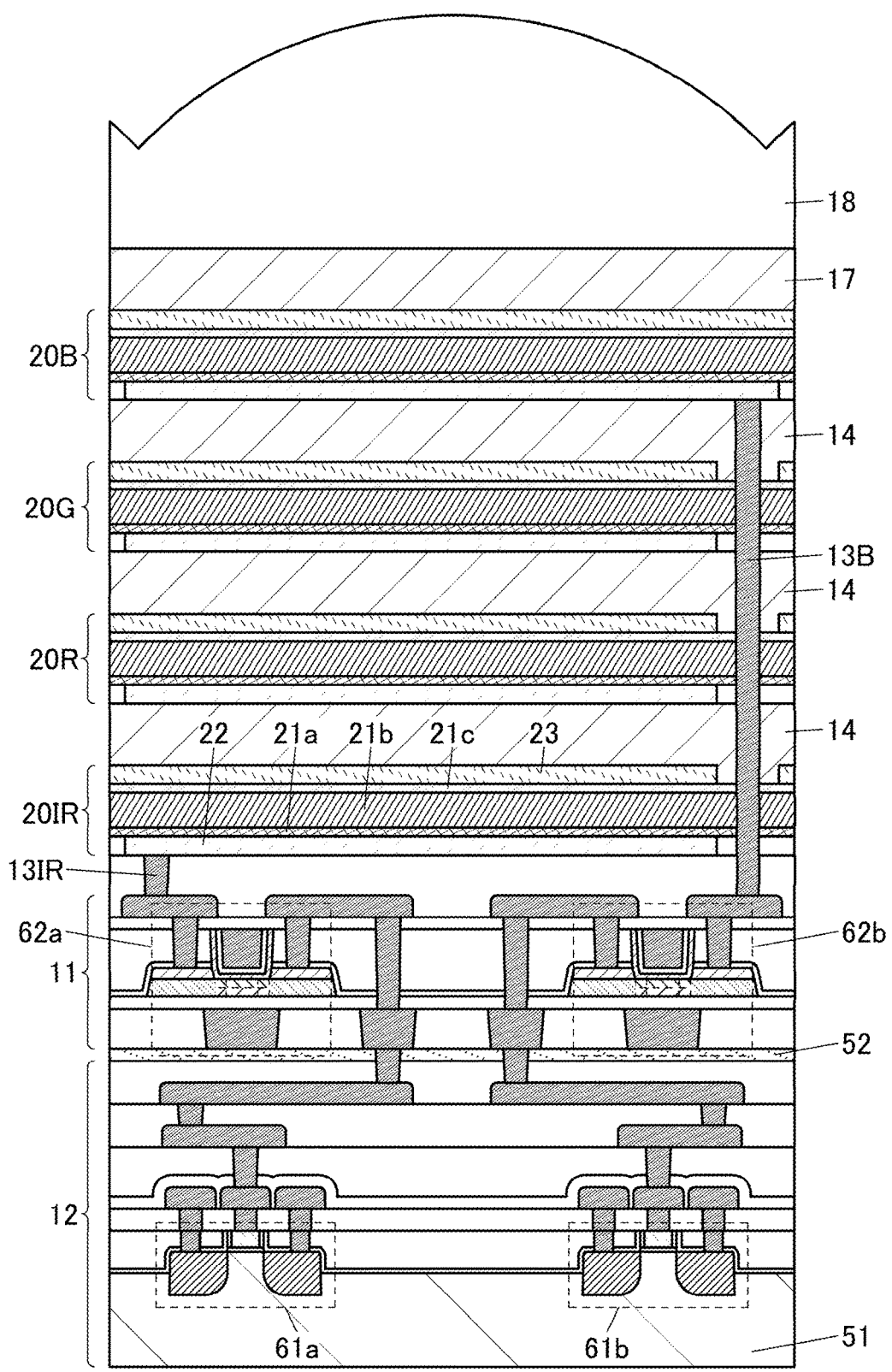
FIG. 8 is a diagram illustrating a structure example of the imaging device.

FIG. 8 is a schematic cross-sectional view of an imaging device. The imaging device has a stacked-layer structure in which the functional layer 12, the functional layer 11, the light-receiving element 20IR, the light-receiving element 20R, the light-receiving element 20G, and the light-receiving element 20G are stacked in this order. Note that the stacking order of the light-receiving elements is not limited to this and can be changed as appropriate.

The functional layer 12 includes components of a circuit provided on a silicon substrate 51. Here, a transistor 61a and a transistor 61b are illustrated as some of the components of the circuit.

The functional layer 12 is provided with the silicon substrate 51, the transistor 61a, the transistor 61b, insulating layers, and conductive layers. Each of the insulating layers has one or more functions of a protective layer, an interlayer insulating layer, and a planarization layer. Each of the conductive layers has one or more functions of a plug, a wiring, an electrode, and the like.

As each of the insulating layers, an inorganic insulating film such as a silicon oxide film, a silicon oxynitride film, a silicon nitride oxide film, a silicon nitride film, or an aluminum oxide film can be used, for example. Alternatively, an organic insulating film of acrylic resin, polyimide resin, or the like may be used. As each of the insulating layers, a stacked-layer film in which two or more inorganic insulating films or organic insulating films described above are stacked may be used.

For each of the conductive layers that can be used as a wiring, an electrode, or a plug, a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing the above metal element; an alloy containing a combination of the above metal elements; or the like can be selected as appropriate and used. As each of the conductive layers, a stacked-layer film in which two or more conductive films containing the above-described conductive material are stacked may be used.

Figure 9A:
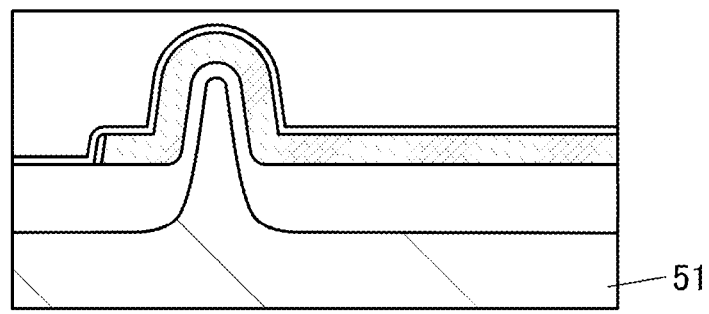
FIG. 9A to FIG. 9C are diagrams illustrating structure examples of transistors.
Figure 9B:
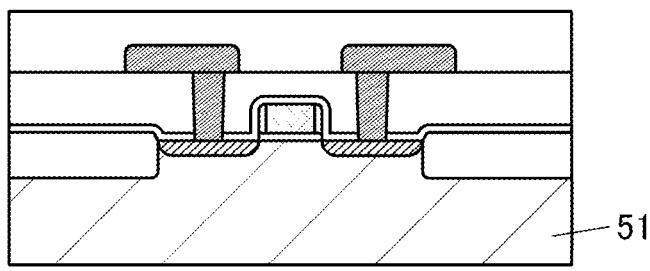

The transistor 61a and the transistor 61b are transistors whose channel is formed in the silicon substrate 51 (also referred to as Si transistors). FIG. 8 illustrates an example of the case in which fin-type transistors are used as the transistor 61a and the transistor 61b. A cross section of a fin-type Si transistor in the channel width direction is illustrated in FIG. 9A. Note that the Si transistors may each be a planar-type transistor as illustrated in FIG. 9B.

Figure 9C:
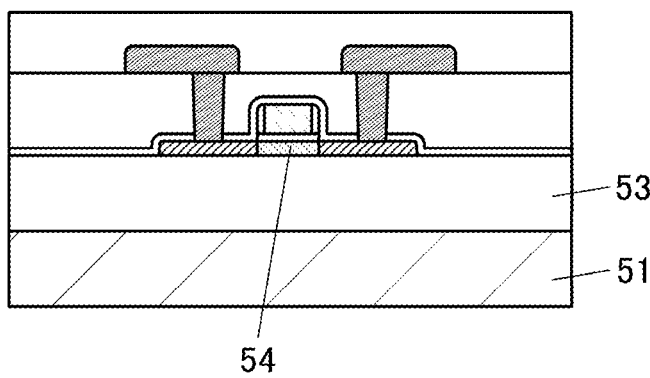

Alternatively, as illustrated in FIG. 9C, the Si transistors may each be a transistor including a semiconductor layer 54 of a silicon thin film. The semiconductor layer 54 can be single crystal silicon (SOI: Silicon on Insulator) formed on an insulating layer 53 on the silicon substrate 51, for example. Polycrystalline silicon may be used for the semiconductor layer 54.

The functional layer 11 includes components of a circuit provided over the functional layer 12. Here, a transistor 62a and a transistor 62b are illustrated as some of the components of the circuit.

The transistor 62a and the transistor 62b are transistors whose channel is formed in an oxide semiconductor layer (also referred to as OS transistors).

An insulating layer 52 is provided between the functional layer 11 and the functional layer 12. The insulating layer 52 functions as a barrier film that prevents diffusion of water, hydrogen, or the like. As the insulating layer 52, an insulating film having a high barrier property against water or hydrogen, such as a silicon nitride film, a silicon nitride oxide film, an aluminum oxide film, an aluminum oxynitride film, a gallium oxide film, a gallium oxynitride film, an yttrium oxide film, an yttrium oxynitride film, a hafnium oxide film, a hafnium oxynitride film, or an yttria-stabilized zirconia (YSZ) film, is preferably used.

In particular, a film having a function of preventing hydrogen diffusion is preferably used as the insulating layer 52 functioning as a barrier film. In a Si device, hydrogen is necessary to terminate dangling bonds; however, hydrogen in the vicinity of an OS transistor is one factor generating carriers in an oxide semiconductor layer, which leads to a decrease in reliability. Therefore, a hydrogen blocking film is preferably provided between the layer in which the Si device is formed and the layer in which the OS transistors are formed.

Figure 10A:
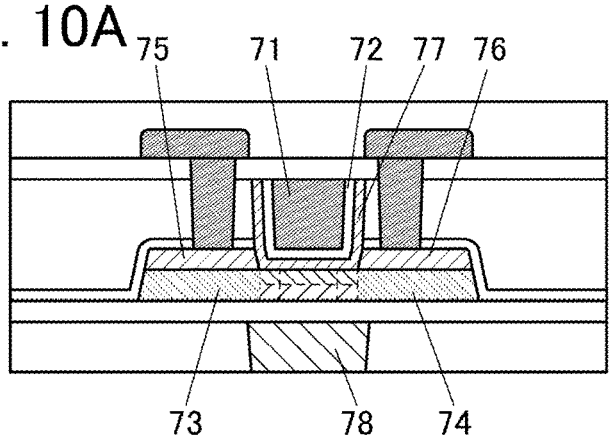
FIG. 10A to FIG. 10D are diagrams illustrating structure examples of the transistors.

FIG. 10A illustrates details of an OS transistor that can be used as the transistor 62a and the transistor 62b. The OS transistor illustrated in FIG. 10A has a self-aligned structure in which a source electrode and a drain electrode are formed through provision of an insulating layer over stacked layers of a semiconductor layer and a conductive layer and provision of opening portions reaching the semiconductor layer.

The OS transistor can include a gate electrode 71 and a gate insulating layer 72 in addition to a channel formation region, a source region 73, and a drain region 74, which are formed in the oxide semiconductor. At least the gate insulating layer 72 and the gate electrode 71 are provided in the opening portion. The opening portion may further be provided with a semiconductor layer 77. A source electrode 75 and a drain electrode 76 are provided over the source region 73 and the drain region 74, respectively.

Figure 10B:
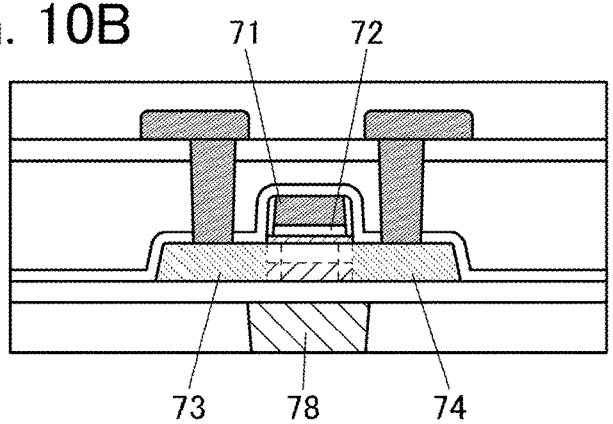

As illustrated in FIG. 10B, the OS transistor may have a self-aligned structure in which the source region 73 and the drain region 74 are formed in the semiconductor layer with the gate electrode 71 as a mask.

Figure 10C:
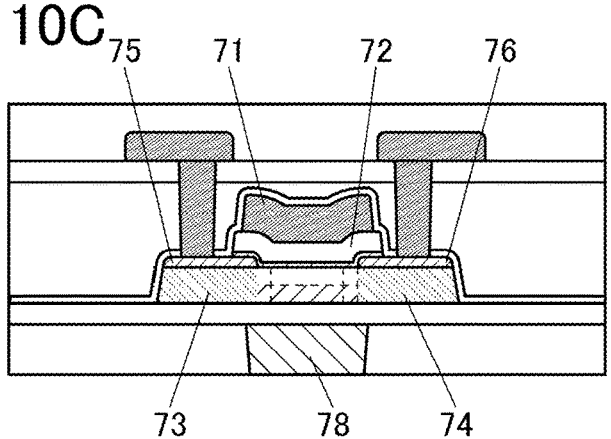

As illustrated in FIG. 10C, the OS transistor may be a non-self-aligned top-gate transistor including a region where the source electrode 75 or the drain electrode 76 overlaps with the gate electrode 71.

Figure 10D:
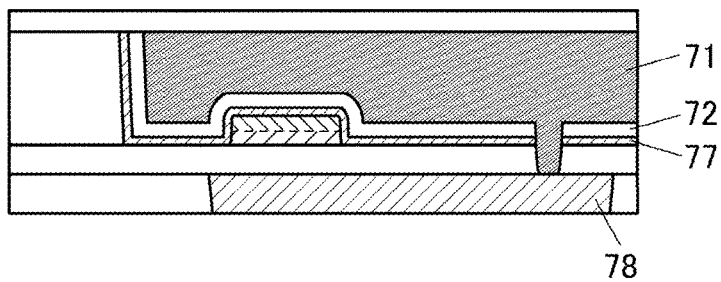

Although the OS transistor has a structure including a backgate 78 here, it may have a structure without a backgate. As illustrated in the cross-sectional view of the OS transistor in the channel width direction illustrated in FIG. 10D, the backgate 78 may be electrically connected to the gate electrode 71 that is provided to face the backgate 78 and functions as a front gate of the OS transistor. Note that FIG. 10D illustrates an example of the cross section of the OS transistor illustrated in FIG. 10A, and the same applies to the other structure transistors. A structure where a fixed potential or a signal different from that supplied to the front gate is supplied to the backgate 78 may be employed.

In FIG. 8, the light-receiving element 20IR, the light-receiving element 20R, the light-receiving element 20G, and the light-receiving element 20B are stacked over the functional layer 11.

Each of the light-receiving elements has a structure in which the conductive layer 22, the buffer layer 21a, the active layer 21b, the buffer layer 21c, and the conductive layer 23 are stacked. The light-receiving elements preferably contain different organic compounds from each other in their active layers 21b. The buffer layer 21a and the buffer layer 21c in each of the light-receiving elements preferably contain a metal or an organic compound. The light-receiving elements may contain different materials (metals or organic compounds) from each other in their buffer layers 21a and their buffer layers 21c, or the same material may be used for two or more of the light-receiving elements.

One of the buffer layer 21a and the buffer layer 21c functions as one or both of a hole-transport layer and a hole-injection layer. The other of the buffer layer 21a and the buffer layer 21c functions as one or both of an electron-transport layer and an electron-injection layer. The active layer 21b functions as a photoelectric conversion layer.

As the photoelectric conversion layer, a mixed layer of an n-type organic semiconductor and a p-type organic semiconductor (bulk heterojunction structure) can be used.

The buffer layer 21a, the active layer 21b, and the buffer layer 21c and materials that can be used therefor are described below.

The hole-injection layer is a layer which injects holes from the electrode to the light-receiving element. The hole-injection layer is a layer containing a material with a high hole-injection property. As the material having a high hole-injection property, a composite material containing a hole-transport material and an acceptor material (an electron-accepting material), an aromatic amine compound, or the like can be used.

The hole-transport layer is a layer which transports holes. The hole-transport layer is a layer containing a hole-transport material. As the hole-transport material, a substance having a hole mobility greater than or equal to $10^{-6}$ cm$^2$/Vs is preferable. Note that other substances can also be used as long as they have a property of transporting more holes than electrons. As the hole-transport material, a material having a high hole-transport property, such as a π-electron rich heteroaromatic compound (e.g., a carbazole derivative, a thiophene derivative, and a furan derivative) or an aromatic amine (a compound having an aromatic amine skeleton), is preferable.

The electron-transport layer is a layer which transports electrons. The electron-transport layer is a layer containing an electron-transport material. As the electron-transport material, a substance having an electron mobility greater than or equal to $1 \times 10^{-6}$ cm$^2$/Vs is preferable. Note that other substances can also be used as long as they have a property of transporting more electrons than holes. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

The electron-injection layer is a layer which injects electrons from the electrode to the light-receiving element. The electron-injection layer is a layer containing a material with a high electron-injection property. As the material with a high electron-injection property, a material containing a metal such as an alkali metal, an alkaline earth metal, or a compound thereof can be used. As the material with a high electron-injection property, a composite material containing an electron-transport material and a donor material (electron-donating material) can also be used.

Examples of an n-type semiconductor contained in the active layer 21b are electron-accepting organic semiconductor materials such as fullerene (e.g., $C_{60}$ and $C_{70}$) and fullerene derivatives. Fullerene has a soccer ball-like shape, which is energetically stable. Both the HOMO level and the LUMO level of fullerene are deep (low). Having a deep LUMO level, fullerene has an extremely high electron-accepting property (acceptor property). When π-electron conjugation (resonance) spreads in a plane as in benzene, the electron-donating property (donor property) usually increases. Although π-electrons widely spread, fullerene has a high electron-accepting property because of having a spherical shape. The high electron-accepting property efficiently causes rapid electric charge separation and is useful for a light-receiving element. Both $C_{60}$ and $C_{70}$ have a wide absorption band in the visible light region, and $C_{70}$ is especially preferable because of having a larger π-electron conjugation system and a wider absorption band in the long wavelength region than $C_{60}$.

Examples of the n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer 21b include electron-donating organic semiconductor materials such as copper(II) phthalocyanine (CuPc), tetraphenyldibenzoperiflanthene (DBP), zinc phthalocyanine (ZnPc), tin phthalocyanine (SnPc), and quinacridone.

Examples of a p-type semiconductor material include a carbazole derivative, a thiophene derivative, a furan derivative, and a compound having an aromatic amine skeleton. Other examples of the p-type semiconductor material include a naphthalene derivative, an anthracene derivative, a tetracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For example, the active layer 21b is preferably formed by co-evaporation of an n-type semiconductor and a p-type semiconductor.

For the buffer layer 21a, the active layer 21b, and the buffer layer 21c, either a low molecular compound or a high molecular compound can be used, and an inorganic compound may also be contained. Each of the layers can be formed by a method such as an evaporation method (including a vacuum evaporation method), a transfer method, a printing method, an inkjet method, or a coating method.

The buffer layer 21a, the active layer 21b, and the buffer layer 21c can have a single-layer structure containing a single material (compound), a single-layer structure containing a plurality of materials, a stacked-layer structure in which two or more layers each containing a single material are stacked, a stacked-layer structure in which two or more layers each containing a plurality of materials are stacked, or a stacked-layer structure in which one or more layers each containing a single material and one or more layers each containing a plurality of materials are stacked. In the case where the layer including a plurality of materials is formed by a vacuum evaporation method, either a co-evaporation method for depositing a film by making each of two or more materials evaporate or sublimate or a premix method for depositing a film by making a mixed material, which is previously prepared by mixing two or more materials, evaporate or sublimate may be used. Alternatively, the co-evaporation method and the premix method may be combined in depositing a layer containing three or more materials.

FIG. 8 clearly illustrates each of the plug 13IR which electrically connects the transistor 62a and the conductive layer 22 of the light-receiving element 20IR to each other and the plug 13B which electrically connects the transistor 62b and the conductive layer 22 of the light-receiving element 20B to each other.

The plug 13IR is electrically connected to one of a source and a drain of the transistor 62a. In FIG. 8, an example in which the other of the source and the drain of the transistor 62a is electrically connected to a gate of the transistor 61a is illustrated. Similarly, the plug 13B is electrically connected to one of a source and a drain of the transistor 62b.

The other of the source and the drain of the transistor 62b is electrically connected to a gate of the transistor 61b. In this case, the transistor 62a and the transistor 61a form part of a pixel circuit, and the transistor 62b and the transistor 61b form part of another pixel circuit. For example, the transistor 62a and the transistor 62b each function as a transfer transistor, and the transistor 61a and the transistor 61b function as amplifier transistors. Note that the connection relation of the transistors is not limited to the structure illustrated in FIG. 8.

In FIG. 8, an example in which the plug 13B is provided to be in contact with the buffer layers 21a, the active layers 21b, and the buffer layers 21c included in the light-receiving element 20G, the light-receiving element 20R, and the light-receiving element 20IR is illustrated. Note that as illustrated in FIG. 6 and the like as an example, the structure in which the plug 13B and the like are not in contact with those may also be employed.

In FIG. 8, a microlens array 18 is provided over the light-receiving element 20B with an insulating layer 17 therebetween. The microlens array 18 has a function of condensing incident light so that light can efficiently enter the light-receiving elements. A lens included in the microlens array 18 may be placed per pixel or per two or more pixels. For example, a microlens array in which lenses each covering 2×2 pixels are arranged may be used.

Structure Example 1-2

A structure example of an imaging device having a structure different from the above is described below. Note that description of the portions overlapping with the above is omitted and different portions will be described.

Figure 11:
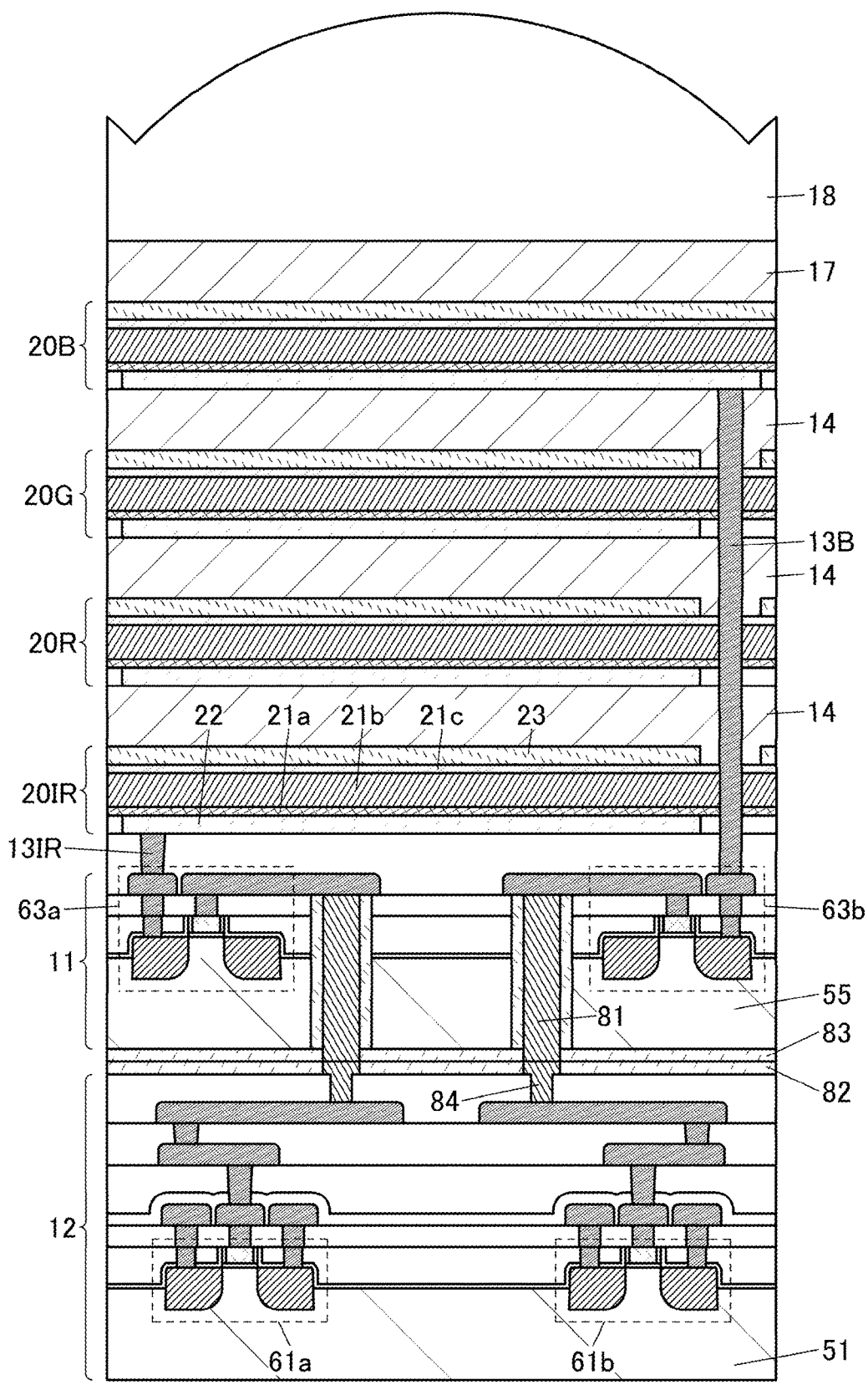
FIG. 11 is a diagram illustrating a structure example of the imaging device.

FIG. 11 illustrates a schematic cross-sectional view of an imaging device having a structure partly different from that of the above-described structure example 1. The imaging device illustrated in FIG. 11 is mainly different from the above-described structure example 1 in having a different structure of the functional layer 11.

The functional layer 11 includes components of a circuit provided on a silicon substrate 55. Here, a transistor 63a and a transistor 63b are illustrated as some of the components of the circuit.

The functional layer 11 is provided with the silicon substrate, the transistor 63a, the transistor 63b, insulating layers, and conductive layers. Each of the insulating layers has one or more functions of a protective layer, an interlayer insulating layer, and a planarization layer. Each of the conductive layers has one or more functions of a plug, a wiring, an electrode, and the like.

The transistor 63a and the transistor 63b are Si transistors whose channel is formed in the silicon substrate 55. FIG. 11 illustrates an example of the case in which fin-type transistors are used as the transistor 63a and the transistor 63b. Note that the transistor illustrated in FIG. 9A, FIG. 9B, or FIG. 9C may also be used.

An insulating layer 82 and an insulating layer 83 positioned between the functional layer 11 and the functional layer 12 function as attachment layers. Surfaces corresponding to attachment surfaces of the insulating layer 82 and the insulating layer 83 are each planarized. The insulating layer 82 and the insulating layer 83 are preferably formed using the same material.

A plug 81 reaching the attachment surface is provided in the silicon substrate 55. An end of the plug 81 is electrically connected to the transistor 63a or the transistor 63b. The other end of the plug 81 is connected to a plug 84 included in the functional layer 12. The functional layer 11 and the functional layer 12 are electrically connected to each other through the plug 81 and the plug 84, and signal transmission and reception can be performed through these plugs.

Structure Example 1-3

Figure 12:
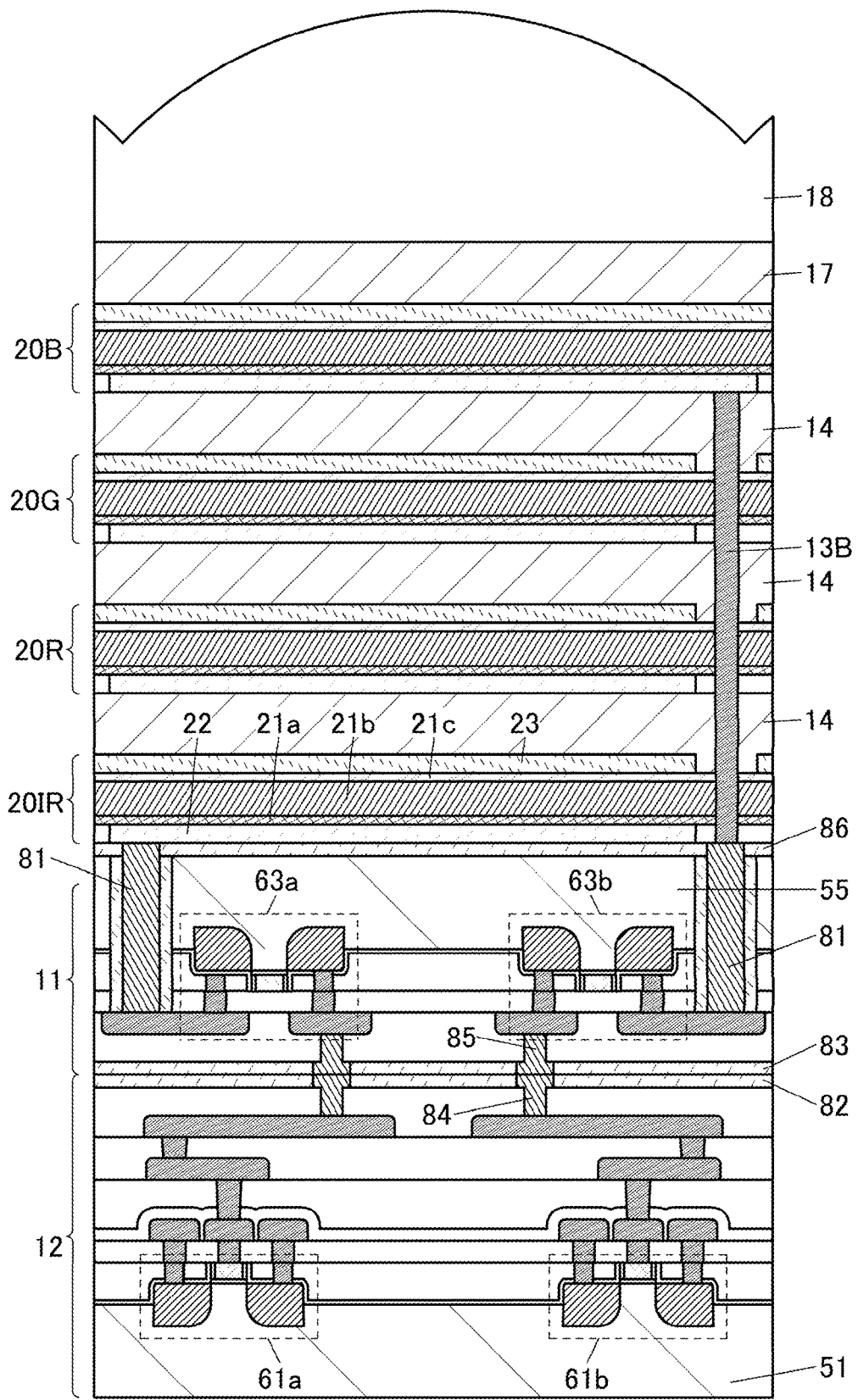
FIG. 12 is a diagram illustrating a structure example of the imaging device.

The structure illustrated in FIG. 12 is mainly different from the above-described structure example 2 in having a different structure of the functional layer 11. The imaging device illustrated in FIG. 12 has a structure obtained by inverting up and down the functional layer 11 of the above-described structure example 2.

An insulating layer 86 is provided over a surface on the rear side (a surface not provided with the transistor 63a and the like) of the silicon substrate 55, and the light-receiving element 20IR is provided over the insulating layer 86.

Some of the plurality of plugs 81 provided in the silicon substrate 55 are electrically connected to the plug 13B and the like through the insulating layer 86. Other plugs 81 are provided in contact with the conductive layer 22 included in the light-receiving element 20IR. In other words, the plugs 81 also serve as the plugs 13IR in the structure of FIG. 12.

Furthermore, a plug 85 is provided on the connection surface side of the functional layer 11 with the functional layer 12. The plug 85 is connected to the plug 84 included in the functional layer 12.

Structure Example 2 of Imaging Device

As one of the plurality of light-receiving elements included in the imaging device, a light-receiving element formed on a semiconductor substrate can be used. An imaging device including both light-receiving elements using organic compounds and a light-receiving element formed on a semiconductor substrate is described below.

Structure Example 2-1

Figure 13:
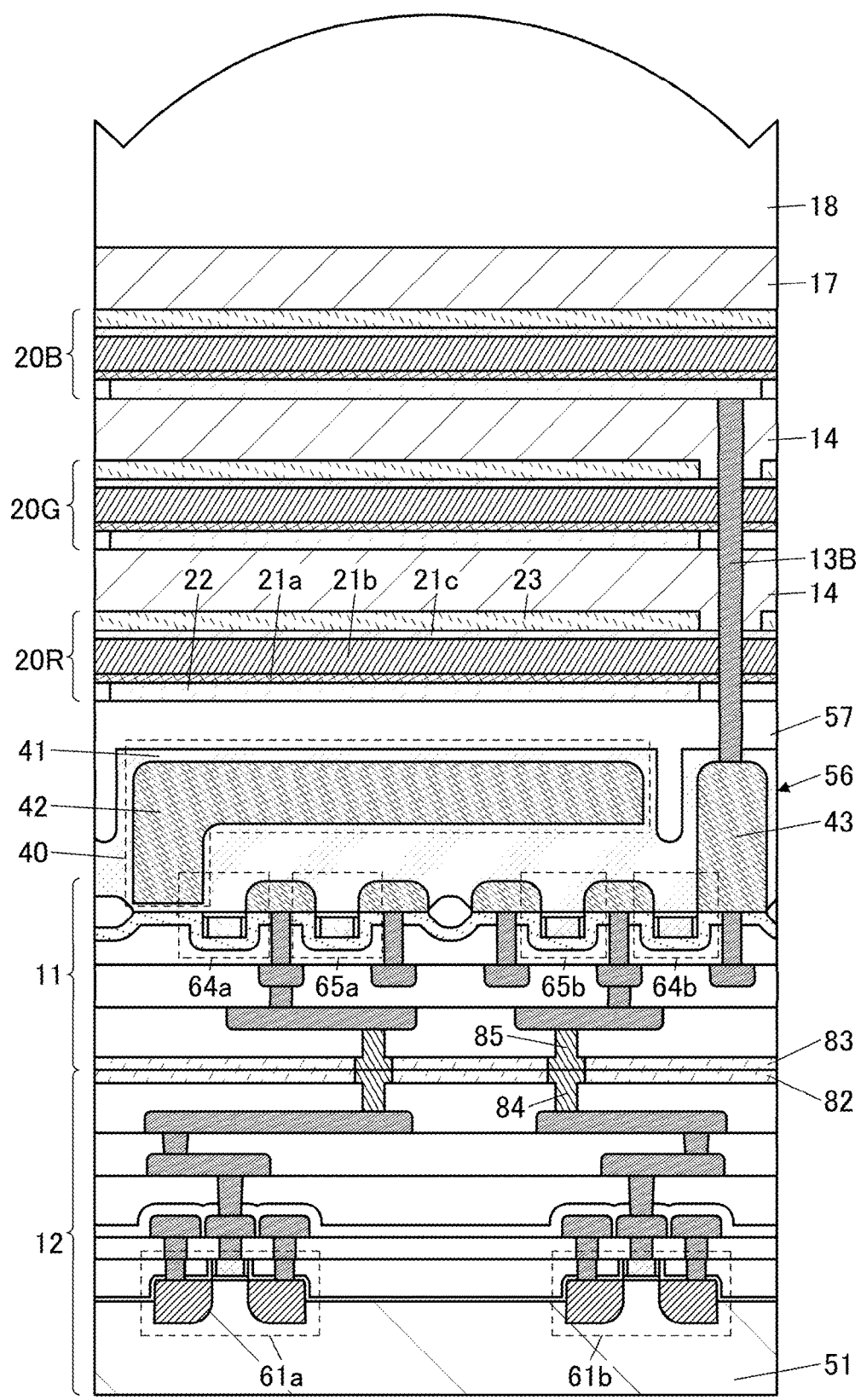
FIG. 13 is a diagram illustrating a structure example of the imaging device.

FIG. 13 illustrates a schematic cross-sectional view of an imaging device. The structure illustrated in FIG. 13 is mainly different from the structure described above as an example with reference to FIG. 12 in having a different structure of the functional layer 11 and in including a light-receiving element 40 instead of the light-receiving element 20IR.

The light-receiving element 40 is a pn-junction photodiode formed in a silicon substrate 56. The light-receiving element 40 includes a region 41 corresponding to a p-type region and a region 42 corresponding to an n-type region. The light-receiving element 40 illustrated in FIG. 13 is a buried photodiode, which can suppress a dark current and reduce noise with the thin p-type region (part of the region 41) provided on the surface side (current extraction side) of the region 42.

The silicon substrate 56 is provided with an element isolation layer. Specifically, a groove for separating pixels is provided in the silicon substrate 56, and an insulating layer 57 is provided on the top surface of the silicon substrate 56 and in the groove. The insulating layer 57 can suppress leakage of carriers generated in the light-receiving element 40 to an adjacent pixel. The insulating layer 57 also has a function of suppressing entry of stray light.

Furthermore, the silicon substrate 56 is provided with a region 43 corresponding to an n-type region, separately from the light-receiving element 40. An opening portion reaching the region 43 is provided in the insulating layer 57 and the silicon substrate 56, and the plug 13B is provided in the opening portion. The plug 13B electrically connects the conductive layer 22 of the light-receiving element 20B and the region 43 to each other. Note that a similar structure can apply to the plug 13G and the plug 13R, which are not illustrated.

The functional layer 11 includes a transistor 64a, a transistor 65a, a transistor 64b, and a transistor 65b. Each of the transistors is a transistor whose channel is formed in the silicon substrate 56.

Part of the region 42 included in the light-receiving element 40 also serves as one of a source and a drain of the transistor 64a. The region 43 provided in the silicon substrate 56 also serves as one of a source and a drain of the transistor 64b. In FIG. 13, the transistor 65a connected in series with the transistor 64a and the transistor 65b connected in series with the transistor 64b are illustrated.

The other of the source and the drain of the transistor 64a is electrically connected to the gate of the transistor 61a in the functional layer 12 through the plug 85 and the plug 84. The other of the source and the drain of the transistor 64b is electrically connected to the gate of the transistor 61b in the functional layer 12 through the plug 85 and the plug 84.

Here, the light-receiving element 40 includes a region overlapping with the transistor 64a, the transistor 65a, the transistor 64b, and the transistor 65b. This allows an increase in the aperture ratio (effective light-receiving area ratio) of pixels and thus a highly sensitive imaging device can be achieved.

For example, the imaging device illustrated as an example in FIG. 13 can have a structure in which the light-receiving element 20B, the light-receiving element 20G, and the light-receiving element 20R receive blue light, green light, and red light respectively and the light-receiving element 40 receives infrared light. The structure is not limited to this, and a structure in which the light-receiving element 40 receives any kind of visible light may be employed.

As the substrate in which the light-receiving element 40 is formed, a substrate other than a silicon substrate may be used. Silicon carbide, an oxide semiconductor, gallium nitride, or the like that has a wider band gap than silicon can be used, for example. This makes it possible to form a light-receiving element that generates electric charge by absorbing ultraviolet light.

Structure Example 2-2

Figure 14:
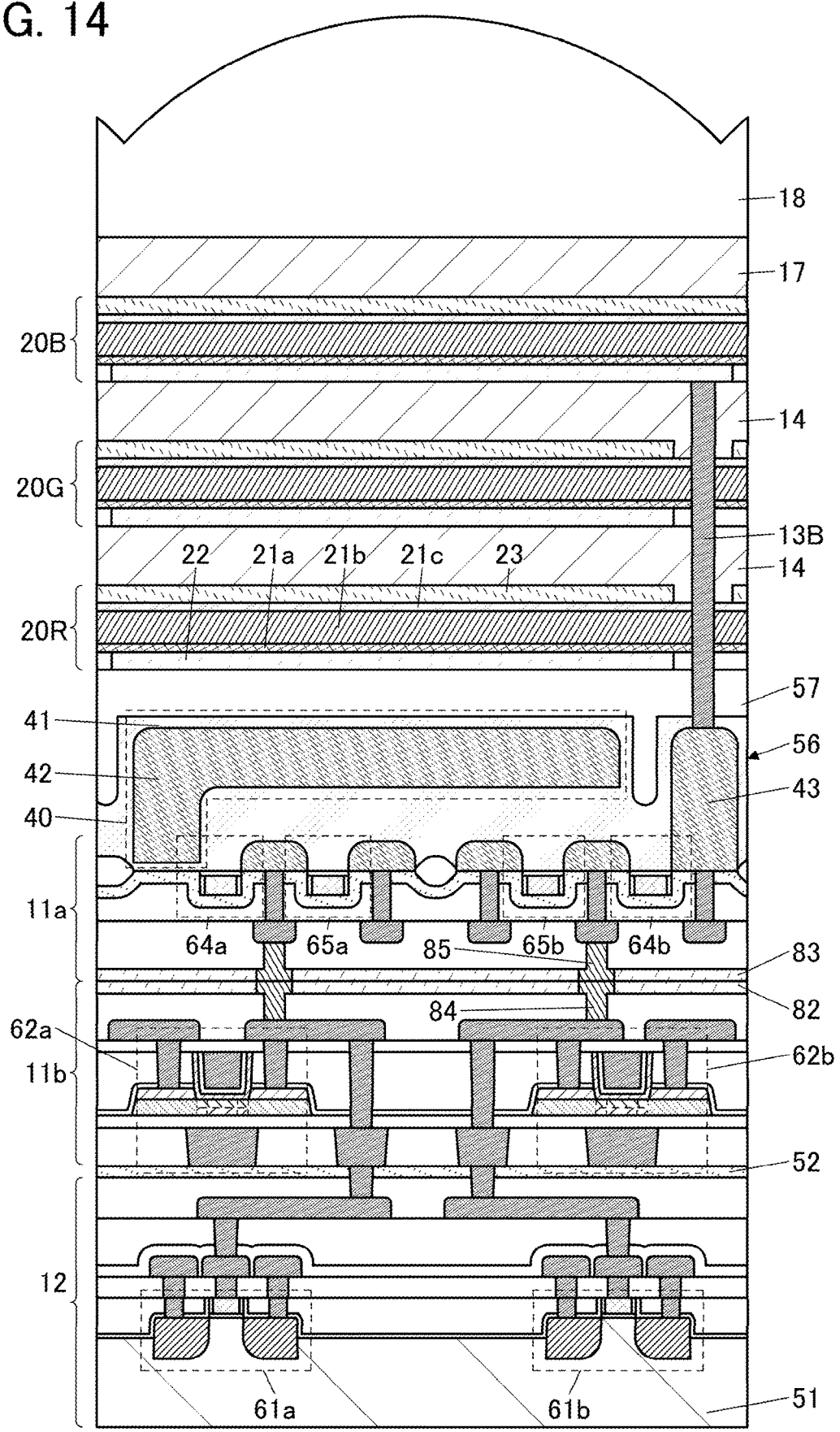
FIG. 14 is a diagram illustrating a structure example of the imaging device.

A structure illustrated in FIG. 14 is different from the structure illustrated as an example in FIG. 13 in including a functional layer 11a and a functional layer 11b instead of the functional layer 11. In other words, an imaging device illustrated in FIG. 14 has a structure in which four light-receiving elements and three functional layers are stacked.

To the functional layer 11a and the light-receiving element 40, the structure of the functional layer 11 and the light-receiving element 40 illustrated as an example in FIG. 13 can be applied. In other words, the light-receiving element 40, the transistor 64a, the transistor 65a, the transistor 64b, and the transistor 65b are provided in the silicon substrate 56.

To the structure of the functional layer 11b, a structure similar to that of the functional layer 11 illustrated as an example in FIG. 8 can be applied. In other words, an OS transistor is used as each of the transistor 62a and the transistor 62b included in the functional layer 11b.

In the imaging device illustrated in FIG. 14, the functional layer 11a and the functional layer 11b are attached to each other. Specifically, the insulating layer 83 provided on a bottom surface of the functional layer 11a is attached to the insulating layer 82 provided on a top surface of the functional layer 11b. Furthermore, signal transmission and reception can be performed between the functional layer 11a and the functional layer 11b through the plug 84 and the plug 85.

In FIG. 14, the other of the source and the drain of the transistor 64a is electrically connected to the one of the source and the drain of the transistor 62a and the gate of the transistor 61a. Furthermore, the other of the source and the drain of the transistor 64b is electrically connected to the one of the source and the drain of the transistor 62b and the gate of the transistor 61b. Note that the connection relation of the transistors is not limited to this.

Thus, by staking three or more functional layers, a multifunctional imaging device can be achieved with the area increase suppressed.

Structure Example 2-3

Figure 15:
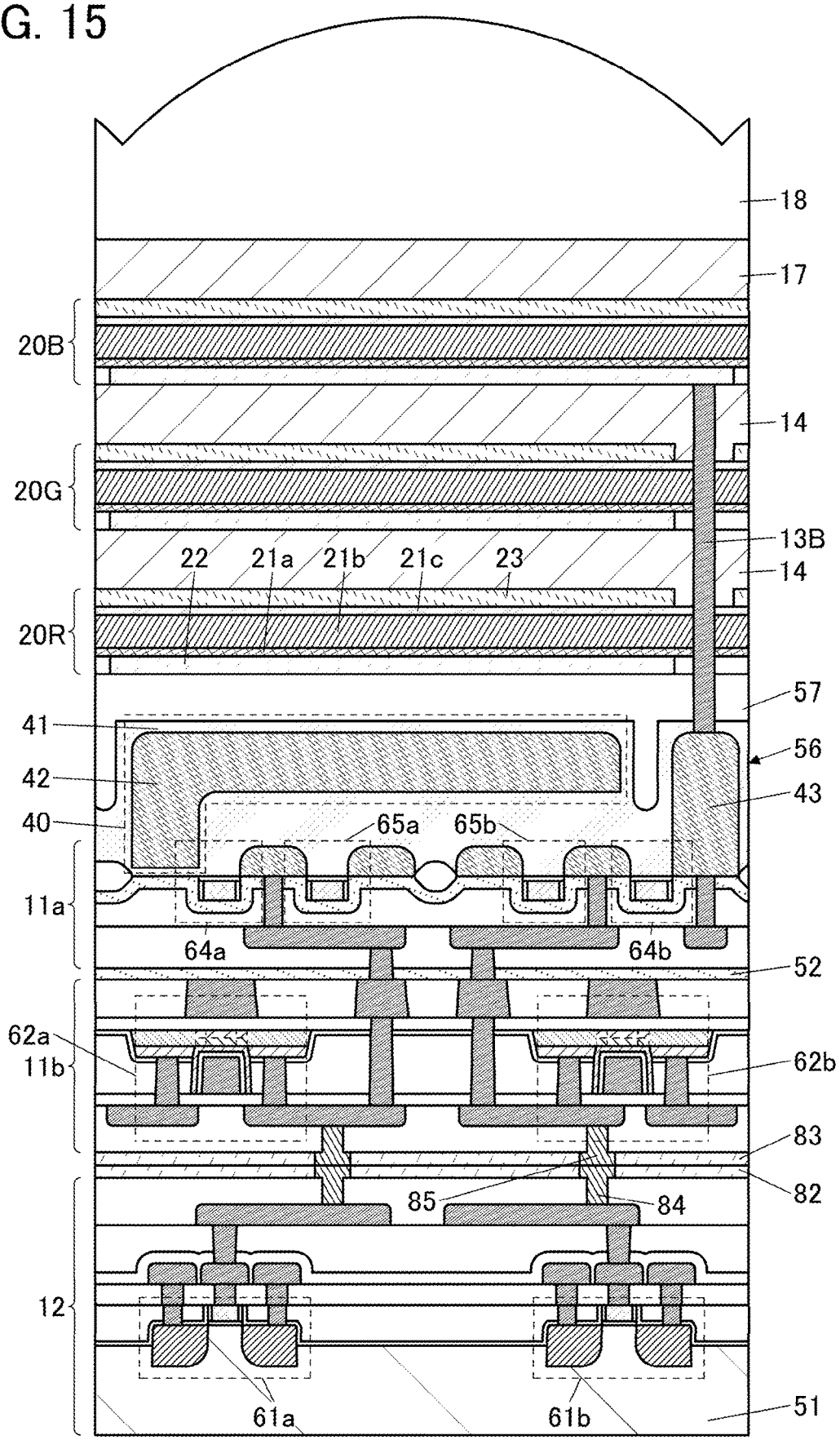
FIG. 15 is a diagram illustrating a structure example of the imaging device.

An imaging device illustrated in FIG. 15 has a structure obtained by inverting up and down the functional layer 11b illustrated as an example in FIG. 14.

The functional layer 11a and the functional layer 11b are formed to be stacked with the insulating layer 52 therebetween.

In the imaging device illustrated in FIG. 15, the functional layer 11b and the functional layer 12 are attached to each other. Specifically, the insulating layer 83 provided on a bottom surface of the functional layer 11b and the insulating layer 82 provided on a top surface of the functional layer 12 are attached to each other. Furthermore, signal transmission and reception can be performed between the functional layer 11b and the functional layer 12 through the plug 85 and the plug 84.

The above is the description of the structure examples of the imaging device.

The imaging devices described as examples in this embodiment each have a structure in which the plurality of light-receiving elements and the plurality of functional layers are stacked. Not only capturing a full-color image with one kind of pixels but also capturing an infrared light image is possible. Thus, the number of parts and power consumption as well as manufacturing costs can be reduced in an electronic device including the imaging device. Furthermore, a deviation in image capturing position between a color image and an infrared light image does not occur in principle, compared with the case where a visible-light imaging element and an infrared-light imaging element are placed side by side for image capturing. Accordingly, the imaging devices have a secondary effect such as no need of image processing for correcting such deviations.

Furthermore, the imaging devices described as examples in this embodiment can reduce the area of pixels without sacrificing the sensitivity and the aperture ratio. Moreover, a variety of circuits can be provided so as to overlap with the pixels, which facilitates formation of a multifunctional imaging device. Furthermore, an imaging device capable of capturing a high-definition color image can be provided. Alternatively, an imaging device capable of capturing a high-definition color image and a high-definition infrared light image can be provided. Alternatively, an imaging device that can easily achieve a higher resolution can be provided. Alternatively, an imaging device that can easily achieve a higher aperture ratio can be provided. Alternatively, a multifunctional imaging device can be provided.

At least part of the structure examples, the drawings corresponding thereto, and the like described in this embodiment as an example can be combined with the other structure examples, the other drawings, and the like as appropriate.

At least part of this embodiment can be implemented in appropriate combination with the other embodiments described in this specification.

Embodiment 2

In this embodiment, an imaging device having an arithmetic function, which is one embodiment of the present invention, is described with reference to drawings.

One embodiment of the present invention is an imaging device having an additional function such as image recognition. The imaging device has a function of retaining analog data (image data) obtained by an image capturing operation in pixels and extracting data obtained by multiplying the analog data by a given weight coefficient. The imaging device has a function of adding the data output from the plurality of pixels (a product-sum operation function).

In addition, when the data taken out from the pixels is taken in a neural network or the like provided inside or outside the imaging device, processing such as image recognition can be performed. Since, in one embodiment of the present invention, an enormous amount of image data can be retained in pixels in an analog data state and an arithmetic operation can be performed in the pixels, processing can be performed efficiently.

As the light-receiving elements included in the imaging device described below as an example, the light-receiving elements including organic compounds and the light-receiving element formed on a single crystal substrate which are described as examples in Embodiment 1 can be used. A circuit or the like included in the imaging device described below as an example can be formed of transistors, wirings, electrodes, and the like included in the functional layer 11 (or the functional layer 11a and the functional layer 11b) and the functional layer 12 described as an example in Embodiment 1.

Imaging Device

Figure 16:
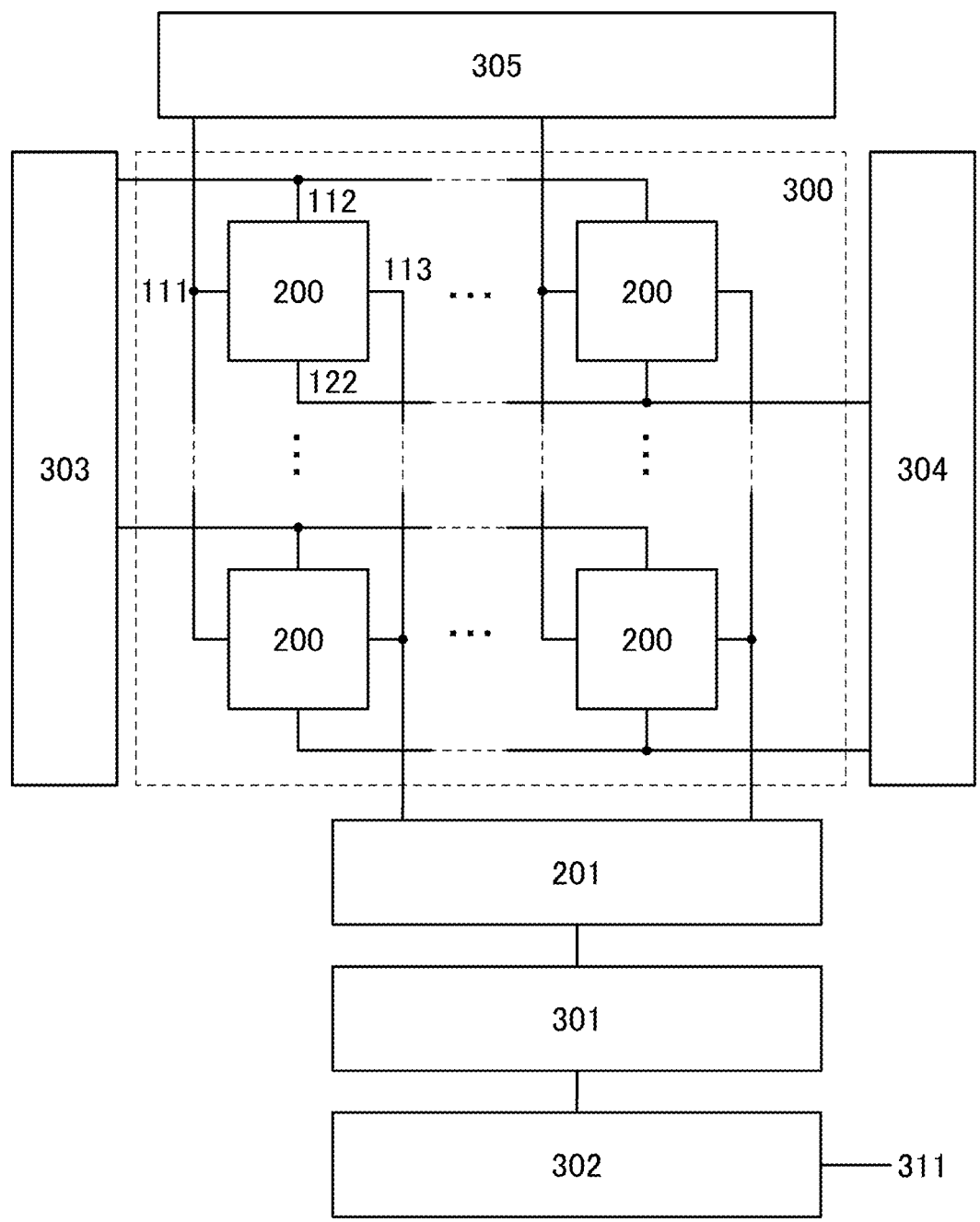
FIG. 16 is a diagram illustrating an imaging device.

FIG. 16 is a block diagram illustrating the imaging device of one embodiment of the present invention. The imaging device includes a pixel array 300, a circuit 201, a circuit 301, a circuit 302, a circuit 303, a circuit 304, and a circuit 305. Note that one or more of the circuit 201, the circuit 301, the circuit 302, the circuit 303, the circuit 304, and the circuit 305 may include a region overlapping with the pixel array 300. Such a structure can reduce the area of the imaging device.

In the imaging device of one embodiment of the present invention, a circuit having two or more functions among the functions of the circuit 201 and the circuit 301 to the circuit 305 may be used alternatively. Moreover, a circuit other than the circuit 201 and the circuit 301 to the circuit 305 may also be used. Furthermore, one or more of the functions of the circuit 201 and the circuit 301 to the circuit 305 may be replaced by a software operation. Some of the circuits 201 and 301 to 305 may be placed outside the imaging device.

The pixel array 300 can have an image capturing function and an arithmetic function. The circuits 201 and 301 can each have an arithmetic function. The circuit 302 can have an arithmetic function or a data conversion function and can output data to a wiring 311. The circuits 303 and 304 can have a selection function. The circuit 305 can have a function of supplying a potential (e.g., a weight) to a pixel. As the circuit having a selection function, a shift register, a decoder, or the like can be used.

Figure 17:
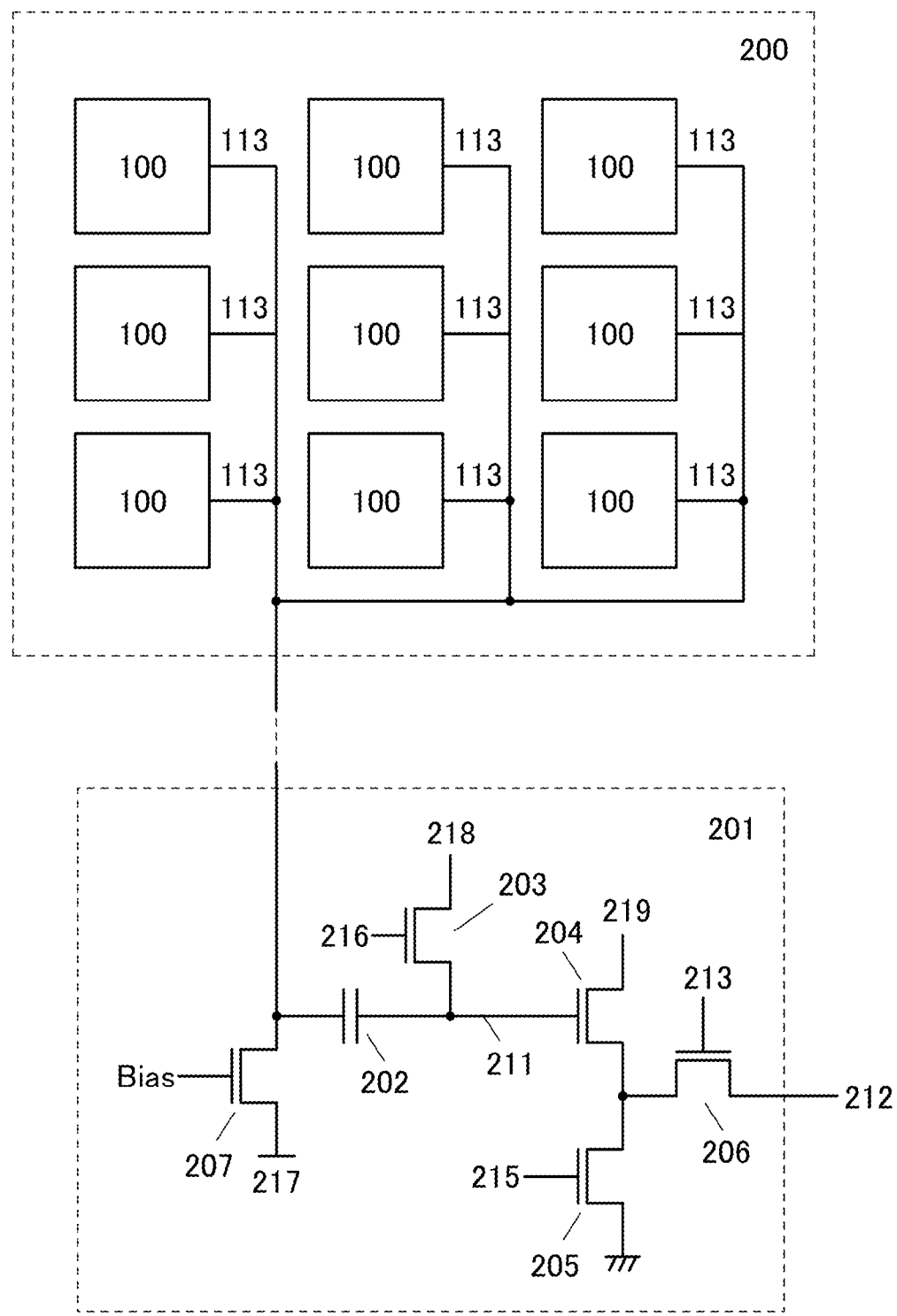
FIG. 17 is a diagram illustrating a pixel block and a circuit.

The pixel array 300 includes a plurality of pixel blocks 200. As illustrated in FIG. 17, the pixel block 200 includes a plurality of pixels 100 arranged in a matrix, and each of the pixels 100 is electrically connected to the circuit 201 through a wiring 113. Note that the circuit 201 can also be provided in the pixel block 200.

The pixels 100 can acquire image data and generate data obtained by adding the image data and a weight coefficient. Note that the number of pixels included in the pixel block 200 is 3×3 in an example illustrated in FIG. 17 but is not limited to this. For example, the number of pixels can be 2×2, 4×4, or the like. Alternatively, the number of pixels in a horizontal direction and the number of pixels in a vertical direction may differ from each other. Furthermore, some pixels may be shared by adjacent pixel blocks.

The pixel block 200 and the circuit 201 can operate as a product-sum operation circuit.

Pixel Circuit

Figure 18A:
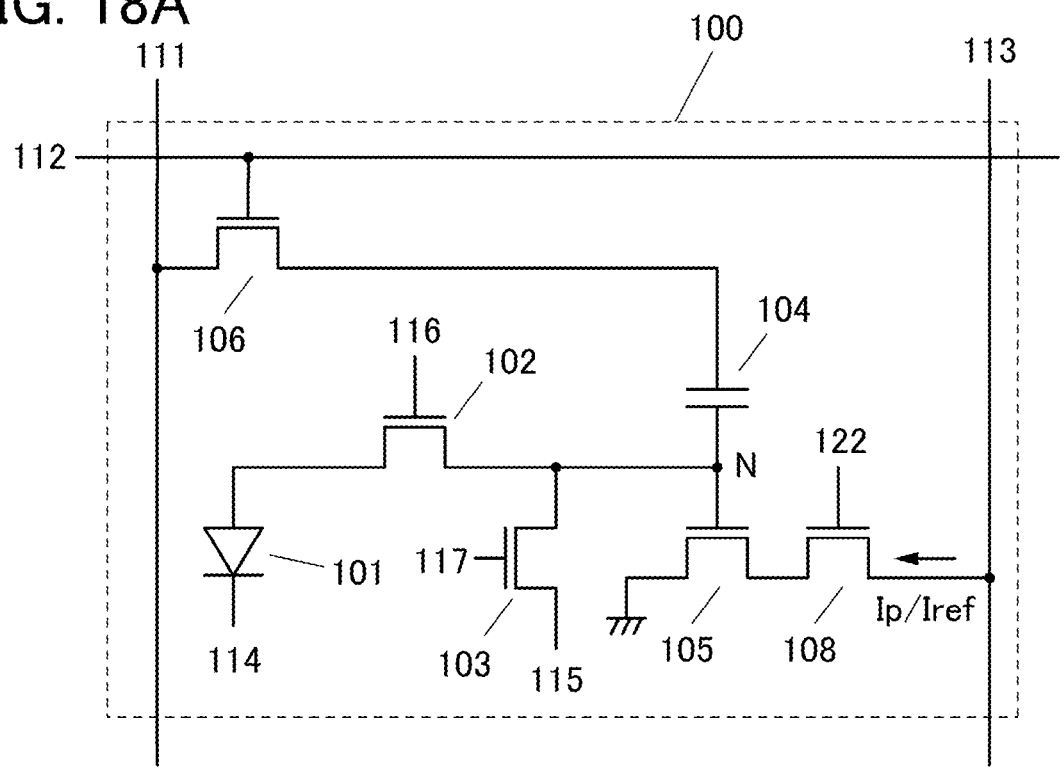
FIG. 18A and FIG. 18B are diagrams each illustrating a pixel.

As illustrated in FIG. 18A, the pixel 100 can include a light-receiving element 101, a transistor 102, a transistor 103, a capacitor 104, a transistor 105, a transistor 106, and a transistor 108. A light-receiving element can also be referred to as a light-receiving device, a photoelectric conversion element, a photoelectric conversion device, or the like.

One electrode of the light-receiving element 101 is electrically connected to one of a source and a drain of the transistor 102. The other of the source and the drain of the transistor 102 is electrically connected to one of a source and a drain of the transistor 103, one electrode of the capacitor 104, and the gate of the transistor 105. One of a source and a drain of the transistor 105 is electrically connected to one of a source and a drain of the transistor 108. The other electrode of the capacitor 104 is electrically connected to one of a source and a drain of the transistor 106.

The other electrode of the light-receiving element 101 is electrically connected to a wiring 114. A gate of the transistor 102 is electrically connected to a wiring 116. The other of the source and the drain of the transistor 103 is electrically connected to a wiring 115. A gate of the transistor 103 is electrically connected to a wiring 117. The other of the source and the drain of the transistor 105 is electrically connected to a GND wiring or the like. The other of the source and the drain of the transistor 108 is electrically connected to the wiring 113. The other of the source and the drain of the transistor 106 is electrically connected to a wiring 111. A gate of the transistor 106 is electrically connected to a wiring 112. A gate of the transistor 108 is electrically connected to a wiring 122.

Here, a point (wiring) where the other of the source and the drain of the transistor 102, the one of the source and the drain of the transistor 103, the one electrode of the capacitor 104, and the gate of the transistor 105 are electrically connected is referred to as a node N.

The wirings 114 and 115 can each have a function of a power supply line. For example, the wiring 114 can function as a high potential power supply line, and the wiring 115 can function as a low potential power supply line. The wirings 112, 116, 117, and 122 can function as signal lines for controlling the electrical conduction of the respective transistors. The wiring 111 can function as a wiring for supplying a potential corresponding to a weight coefficient to the pixel 100. The wiring 113 can function as a wiring which electrically connects the pixel 100 and the circuit 201.

Note that an amplifier circuit, a gain control circuit, or the like may be electrically connected to the wiring 113.

As the light-receiving element 101, a photodiode can be used. In order to increase the light detection sensitivity under low illuminance conditions, an avalanche photodiode may be used.

The transistor 102 can have a function of controlling the potential of the node N. The transistor 103 can have a function of initializing the potential of the node N. The transistor 105 can have a function of controlling a current fed by the circuit 201 in accordance with the potential of the node N. The transistor 108 can have a function of selecting a pixel. The transistor 106 can have a function of supplying the potential corresponding to the weight coefficient to the node N.

Figure 18B:
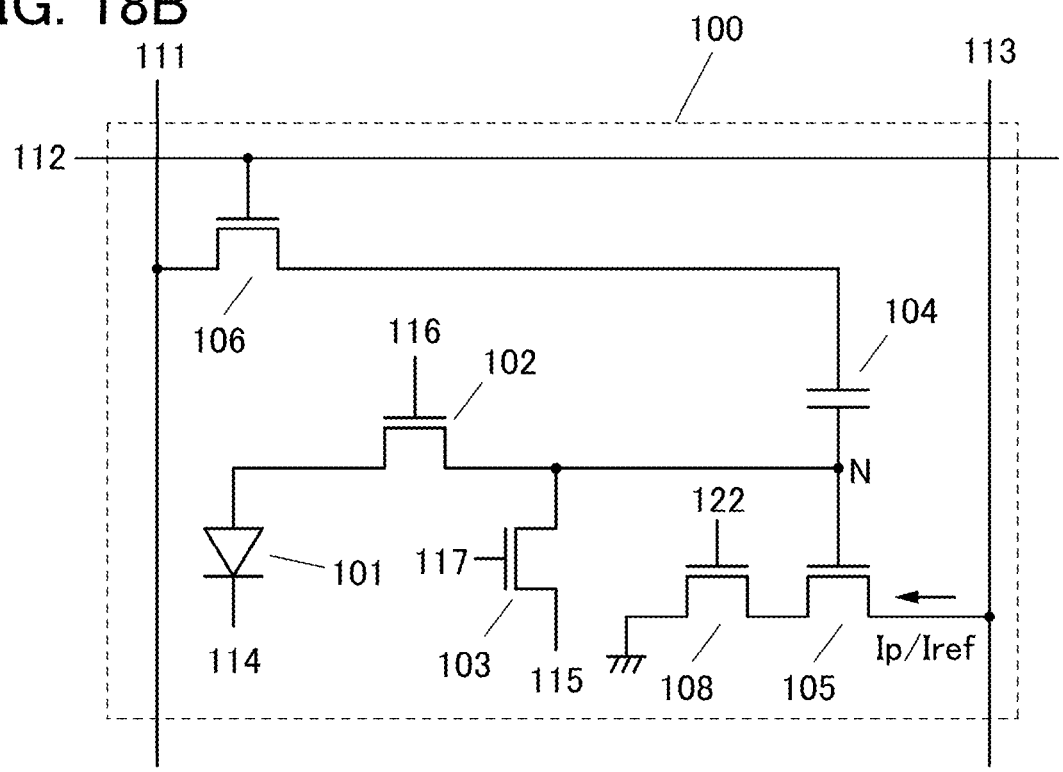

Note that as illustrated in FIG. 18B, the transistor 105 and the transistor 108 may be arranged such that the one of the source and the drain of the transistor 105 is electrically connected to the one of the source and the drain of the transistor 108, the other of the source and the drain of the transistor 105 is connected to the wiring 113, and the other of the source and the drain of the transistor 108 is electrically connected to a GND wiring or the like.

Furthermore, in FIG. 18A and FIG. 18B, the connection direction of the pair of electrodes included in the light-receiving element 101 may be reversed. In that case, the wiring 114 functions as a low potential power supply line and the wiring 115 functions as a high potential power supply line.

The transistors 102 and 103 preferably use transistors using a metal oxide in its channel formation region (OS transistors). The OS transistor has a characteristic of an extremely low off-state current. When OS transistors are used as the transistors 102 and 103, the electric charge retention period at the node N can be elongated greatly. Furthermore, a global shutter mode in which an electric charge accumulation operation is performed in all the pixels at the same time can be employed without complicating the circuit structure, the operation method, and the like. Furthermore, while image data is retained at the node N, an arithmetic operation using the image data can be performed a plurality of times.

Meanwhile, it is sometimes desired that the transistor 105 have excellent amplifying properties. In addition, transistors having high mobility capable of a high-speed operation are sometimes preferably used as the transistors 106 and 108. Accordingly, transistors using silicon in their channel formation regions (Si transistors) may be used as the transistors 105, 106, and 108.

Note that without limitation to the above, an OS transistor and a Si transistor may be freely employed in combination. Alternatively, all the transistors may be OS transistors. Alternatively, all the transistors may be Si transistors. Examples of the Si transistor include a transistor including amorphous silicon and a transistor including crystalline silicon (microcrystalline silicon, low-temperature polysilicon, or single crystal silicon).

The potential of the node N in the pixel 100 is determined by the potential obtained by adding a reset potential supplied from the wiring 115 and a potential (image data) generated by photoelectric conversion by the light-receiving element 101. Alternatively, the potential of the node N is determined by capacitive coupling of the potential corresponding to a weight coefficient supplied from the wiring 111. Consequently, a current corresponding to data in which a given weight coefficient is added to the image data can be made to flow through the transistor 105.

Circuit 201

As illustrated in FIG. 17, the pixels 100 are electrically connected to each other by the wiring 113. The circuit 201 can perform an arithmetic operation using the sum of currents flowing through the transistors 105 of the pixels 100.

The circuit 201 includes a capacitor 202, a transistor 203, a transistor 204, a transistor 205, a transistor 206, and a transistor 207 as a voltage converter circuit. An appropriate analog potential (Bias) is applied to a gate of the transistor 207.

One electrode of the capacitor 202, one of a source and a drain of the transistor 203, and a gate of the transistor 204 are electrically connected to each other. One of a source and a drain of the transistor 204 is electrically connected to one of a source and a drain of the transistor 205 and one of a source and a drain of the transistor 206. The other electrode of the capacitor 202 is electrically connected to the wiring 113 and one of a source and a drain of the transistor 207.

The other of the source and the drain of the transistor 203 is electrically connected to a wiring 218. The other of the source and the drain of the transistor 204 is electrically connected to a wiring 219. The other of the source and the drain of the transistor 205 is electrically connected to a reference power supply line such as a GND wiring. The other of the source and the drain of the transistor 206 is electrically connected to a wiring 212. The other of the source and the drain of the transistor 207 is electrically connected to a wiring 217. A gate of the transistor 203 is electrically connected to a wiring 216. A gate of the transistor 205 is electrically connected to a wiring 215. A gate of the transistor 206 is electrically connected to a wiring 213.

The wiring 217, the wiring 218, and the wiring 219 can each have a function of a power supply line. For example, the wiring 218 can have a function of a wiring that supplies a reset potential (Vr) for reading. The wiring 217 and the wiring 219 can function as high potential power supply lines. The wiring 213, the wiring 215, and the wiring 216 can function as signal lines that control the electrical conduction of the respective transistors. The wiring 212 is an output line and can be electrically connected to the circuit 301 illustrated in FIG. 16, for example.

The transistor 203 can have a function of resetting the potential of the wiring 211 to the potential of the wiring 218. The transistor 204 and the transistor 205 can have a function of source follower circuits. The transistor 206 can have a function of controlling reading. The circuit 201 has a function of a correlated double sampling circuit (a CDS circuit) and can be replaced with a circuit having the function and another structure.

In one embodiment of the present invention, offset components other than the product of image data (X) and a weight coefficient (W) are eliminated, and an objective WX is extracted. WX can be calculated using data obtained from the same pixel when light exposure is performed (image capturing is performed) and when light exposure is not performed (image capturing is not performed), and data obtained by adding the weight to these data.

The total amount of currents ($I_p$) flowing through the pixels 100 when light exposure is performed is $k\Sigma(X-V_{th})^2$, and the total amount of currents ($I_p$) flowing through the pixels 100 when the weight is added is $k\Sigma(W+X-V_{th})^2$. The total amount of currents ($I_{ref}$) flowing through the pixels 100 when light exposure is not performed is $k\Sigma(0-V_{th})^2$, and the total amount of currents ($I_{ref}$) flowing through the pixels 100 when the weight is added is $k\Sigma(W-V_{th})^2$. Here, k is a constant and $V_{th}$ is the threshold voltage of the transistor 105.

First, a difference (data A) between the data obtained when light exposure is performed and the data obtained by adding the weight to the data is calculated. The difference is $k\Sigma((X-V_{th})^2-(W+X-V_{th})^2)=k\Sigma(-W^2-2W\cdot X+2W\cdot V_{th})$.

Next, a difference (data B) between the data obtained when light exposure is not performed and the data obtained by adding the weight to the data is calculated. The difference is $k\Sigma((0-V_{th})^2-(W-V_{th})^2)=k\Sigma(-W^2-2W\cdot V_{th})$.

Then, a difference between the data A and the data B is calculated. The difference is $k\Sigma(-W^2-2W\cdot X+2W\cdot V_{th}-(-W^2-2W\cdot V_{th}))=k\Sigma(-2W\cdot X)$. That is, offset components other than the product of the image data (X) and the weight coefficient (W) can be eliminated.

The circuit 201 can read the data A and the data B. Note that the calculation of the difference between the data A and the data B can be performed by the circuit 301, for example.

Image Capturing Operation

Figure 19A:
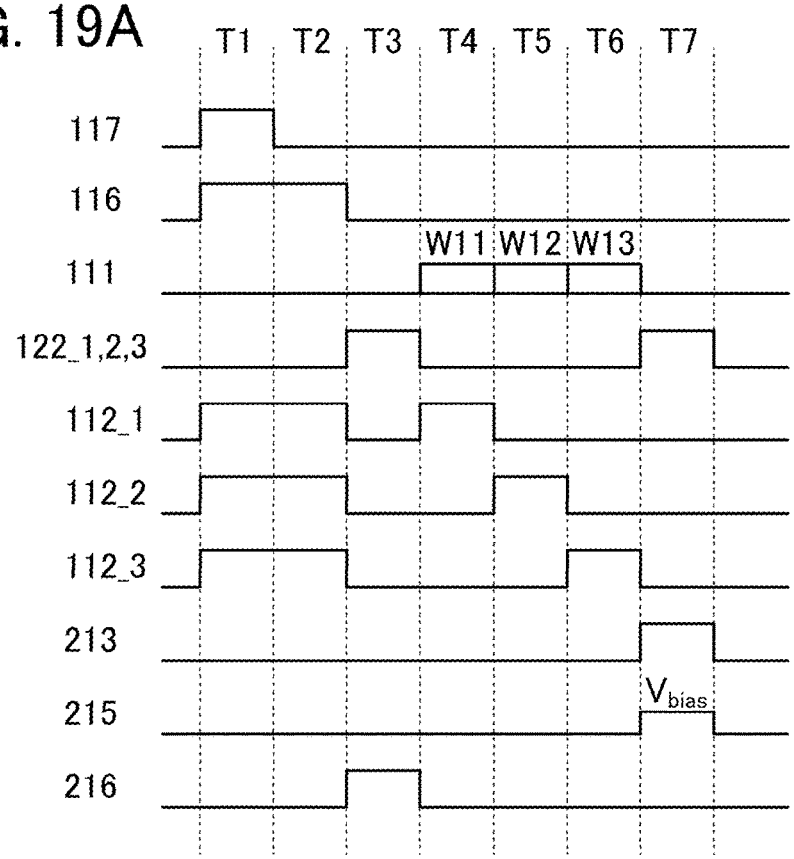
FIG. 19A and FIG. 19B are timing charts illustrating operations of the pixel blocks and the circuit.

FIG. 19A is a timing chart illustrating an operation of calculating the difference (data A) between the data obtained when light exposure is performed and the data obtained by adding the weight to the data in the pixel blocks 200 and the circuit 201. For convenience, the timings of changing signals are matched in the chart; however, in reality, the timings are preferably shifted in consideration of the delay inside the circuit. In the following description, a high potential is represented by "H", and a low potential is represented by "L".

First, in a period T1, the potential of the wiring 117 is set to "H" and the potential of the wiring 116 is set to "H", so that the nodes N in the pixels 100 have reset potentials. Furthermore, the potentials of the wirings 111 are brought to "L" and the potentials of wirings 112_1 to 112_3 (corresponding to the wirings 112 in the first to third rows) are brought to "H", so that weight coefficients 0 are written.

In a period T2, the potential of the wiring 116 is kept at "H" and the potential of the wiring 117 is set to "L", so that the potential X (image data) is written to the nodes N by photoelectric conversion of the light-receiving elements 101.

In a period T3, the potentials of a wiring 122_1, a wiring 122_2, and a wiring 122_3 are set to "H", so that all of the pixels 100 in the pixel blocks are selected. At this time, a current corresponding to the potential X flows to the transistor 105 in each of the pixels 100. The potential of the wiring 216 is set to "H", so that the potential Vr of the wiring 218 is written to the wiring 211. The operation in the periods T1 to T3 corresponds to obtainment of the data obtained when light exposure is performed, and the data is initialized to the potential Vr of the wiring 211.

In a period T4, the potential of the wiring 111 is set to a potential corresponding to a weight coefficient W11 (a weight added to the pixels in the first row), and the potential of the wiring 112_1 is set to "H", so that the weight coefficient W11 is added to the nodes N of the pixels 100 in the first row by capacitive coupling of the capacitors 104.

In a period T5, the potential of the wiring 111 is set to a potential corresponding to a weight coefficient W12 (a weight added to the pixels in the second row), and the potential of the wiring 112_2 is set to "H", so that the weight coefficient W12 is added to the nodes N of the pixels 100 in the second row by capacitive coupling of the capacitors 104.

In a period T6, the potential of the wiring 111 is set to a potential corresponding to a weight coefficient W13 (a weight added to the pixels in the third row), and the potential of the wiring 112_3 is set to "H", so that the weight coefficient W13 is added to the nodes N of the pixels 100 in the third row by capacitive coupling of the capacitors 104. The operation in the period T4 to the period T6 corresponds to generation of data in which weights are added to the data obtained when image capturing is performed.

In a period T7, the potentials of the wirings 122_1, the wiring 122_2, and the wiring 122_3 are set to "H", so that all of the pixels 100 in the pixel blocks are selected. At this time, a current corresponding to the potential W11+X flows to the transistors 105 in the pixels 100 in the first row. A current corresponding to the potential W12+X flows to the transistors 105 in the pixels 100 in the second row. A current corresponding to the potential W13+X flows to the transistors 105 in the pixels 100 in the third row.

Here, the potential of the other electrode of the capacitor 202 changes in accordance with the current flowing through the wiring 113, and an amount Y of change is added to the potential Vr of the wiring 211 by capacitive coupling. Accordingly, the potential of the wiring 211 becomes "Vr+Y". Here, given that Vr=0, Y is the difference itself, which means that the data A is calculated.

The potential of the wiring 213 is set to "H" and the potential of the wiring 215 is set to an appropriate analog potential such as "$V_{bias}$", so that the circuit 201 can output a signal potential in accordance with the data A of the pixel blocks 200 in the first row by a source follower operation.

Figure 19B:
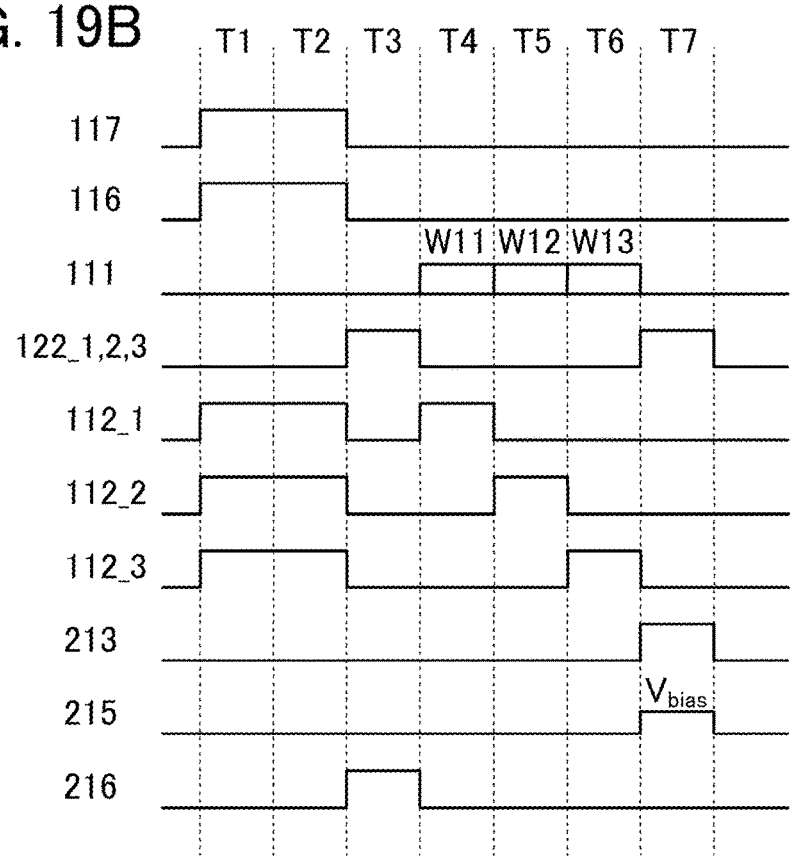

FIG. 19B is a timing chart illustrating an operation of calculating the difference (data B) between the data obtained when light exposure is not performed and the data obtained by adding the weight to the data in the pixel blocks 200 and the circuit 201. Note that the data B may be obtained as needed. For example, the obtained data B may be stored in a memory, and if the input weight is not changed, the data B may be read from the memory. Note that a plurality of pieces of data B corresponding to a plurality of weights may be stored in the memory. Either the data A or the data B may be obtained first.

First, in the periods T1 and T2, the potential of the wiring 117 is set to "H" and the potential of the wiring 116 is set to "H", so that the nodes N in the pixels 100 have reset potentials (0). At the end of the period T2, the potential of the wiring 117 is set to "L" and the potential of the wiring 116 is set to "L". That is, in the periods, the potentials of the nodes N are the reset potentials regardless of the operation of the light-receiving elements 101.

In addition, in the period T1, the potential of the wiring 111 is set to "L" and the wirings 112_1, the wiring 112_2, and the wiring 112_3 are set to "H", so that weight coefficients 0 are written. This operation is performed during a period in which the potentials of the nodes N are the reset potentials.

In a period T3, the potentials of the wiring 122_1, the wiring 122_2, and the wiring 122_3 are set to "H", so that all of the pixels 100 in the pixel blocks are selected. At this time, a current corresponding to the reset potential flows to the transistor 105 in each of the pixels 100. The potential of the wiring 216 is set to "H", so that the potential Vr of the wiring 218 is written to the wiring 211. The operation in the periods T1 to T3 corresponds to obtainment of the data obtained when light exposure is not performed, and the data is initialized to the potential Vr of the wiring 211.

In a period T4, the potential of the wiring 111 is set to a potential corresponding to a weight coefficient W11 (a weight added to the pixels in the first row), and the potential of the wiring 112_1 is set to "H", so that the weight coefficient W11 is added to the nodes N of the pixels 100 in the first row by capacitive coupling of the capacitors 104.

In a period T5, the potential of the wiring 111 is set to a potential corresponding to a weight coefficient W12 (a weight added to the pixels in the second row), and the potential of the wiring 112_2 is set to "H", so that the weight coefficient W12 is added to the nodes N of the pixels 100 in the second row by capacitive coupling of the capacitors 104.

In a period T6, the potential of the wiring 111 is set to a potential corresponding to a weight coefficient W13 (a weight added to the pixels in the third row), and the potential of the wiring 112_3 is set to "H", so that the weight coefficient W13 is added to the nodes N of the pixels 100 in the third row by capacitive coupling of the capacitors 104. The operation in the period T4 and the period T6 corresponds to generation of data in which weights are added to the data obtained when image capturing is not performed.

In a period T7, the potentials of the wirings 122_1, the wiring 122_2, and the wiring 122_3 are set to "H", so that all of the pixels 100 in the pixel blocks are selected. At this time, a current corresponding to the potential W11+0 flows to the transistors 105 in the pixels 100 in the first row. A current corresponding to the potential W12+X flows to the transistors 105 in the pixels 100 in the second row. A current corresponding to the potential W13+0 flows to the transistors 105 in the pixels 100 in the third row.

Here, the potential of the other electrode of the capacitor 202 changes in accordance with the current flowing through the wiring 113, and the amount Y of change is added to the potential Vr of the wiring 211. Accordingly, the potential of the wiring 211 becomes "Vr+Z". Here, given that Vr=0, Z is the difference itself, which means that the data B is calculated.

The potential of the wiring 213 is set to "H" and the potential of the wiring 215 is set to an appropriate analog potential ($V_{bias}$) or the like, so that the circuit 201 can output a signal potential in accordance with the data B of the pixel blocks 200 in the first row by a source follower operation.

The data A and the data B output from the circuit 201 through the above operation are input to the circuit 301. Calculation of the difference between the data A and the data B is performed in the circuit 301, so that unnecessary offset components other than the product of the image data (potential X) and the weight coefficient (potential W) can be eliminated. The circuit 301 may have a structure in which the difference is calculated by utilizing a memory circuit and software processing, other than the structure including an arithmetic circuit such as the circuit 201.

Note that in the above operations, the potential of the wiring 211 of the circuit 201 is initialized to the potential "Vr" both in the operation of obtaining the data A and the operation of obtaining the data B. Then, "(Vr+Y)−(Vr+Z)"="Y−Z" in the following difference calculation, so that the component of the potential "Vr" is eliminated. As described above, the other unnecessary offset components are also eliminated, so that the product of the image data (potential X) and the weight coefficient (potential W) can be extracted.

This operation corresponds to the initial operation of a neural network performing inference or the like. Thus, at least one arithmetic operation can be performed in the imaging device before an enormous amount of image data is taken out to the outside, so that a load reduction, higher-speed processing, and reduction in power consumption in an arithmetic operation in the outside, input and output of data, or the like are achieved.

Alternatively, as an operation other than the operation described above, the potential of the wiring 211 of the circuit 201 may be initialized to different potentials in the operation of obtaining the data A and in the operation of obtaining the data B. For example, the potential of the wiring 211 is initialized to a potential "Vr1" in the operation of obtaining the data A and to a potential "Vr2" in the operation of obtaining the data B. In this case, "(Vr1+Y)−(Vr2+Z)"="(Vr1−Vr2)+(Y−Z)" in the following difference calculation. "Y−Z" is extracted as the product of the image data (potential X) and the weight coefficient (potential W) as in the above operation, and "Vr1−Vr2" is added. Here, "Vr1−Vr2" corresponds to a bias used for threshold value adjustment in the arithmetic operation in a middle layer of the neural network.

Furthermore, the weight has a function of a filter of a convolutional neural network (CNN), for example, and may additionally have a function of amplifying or attenuating data. For example, when the weight coefficient (W) in the operation of obtaining the data A is set to the product of data obtained by the filter processing and an amplified amount, filter processing data corrected to a brighter image can be extracted. The data B is data obtained when image capturing is not performed and thus can also be referred to as black level data. Thus, the operation of calculating the difference between the data A and the data B can be an operation of promoting visualization of an image taken in a dark place. That is, luminance correction using a neural network can be performed.

As described above, a bias can be generated by the operation in the imaging device in one embodiment of the present invention. Furthermore, a functional weight can be added in the imaging device. Thus, a load in an arithmetic operation performed in the outside or the like can be reduced and the imaging device can be employed for a variety of usages. For example, part of processing in inference of a subject, correction of the definition of image data, correction of luminance, generation of a color image from a monochrome image, generation of a three-dimensional image from a two-dimensional image, restoration of defected information, generation of a moving image from a still image, correction of an out-of-focus image, or the like can be performed in the imaging device.

Circuit 301 and Circuit 302

Figure 20A:
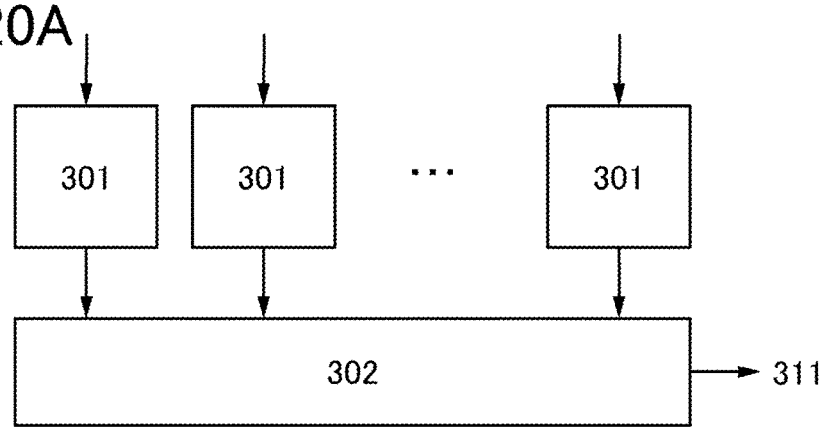
FIG. 20A and FIG. 20B are diagrams illustrating circuits.

FIG. 20A is a diagram illustrating the circuits 301 connected to the circuit 201 and the circuit 302. Product-sum operation result data output from the circuit 201 is sequentially input to the circuits 301. The circuits 301 may have a variety of arithmetic functions in addition to the above-described function of calculating the difference between the data A and the data B. For example, the circuits 301 can have a structure similar to that of the circuit 201. Alternatively, the function of the circuits 301 may be replaced by software processing.

In addition, the circuit 301 may include a circuit that performs an arithmetic operation of an activation function. A comparator circuit can be used as the circuit, for example. A comparator circuit outputs a result of comparing input data and a set threshold as binary data. In other words, the pixel blocks 200 and the circuits 301 can operate as some components of a neural network.

The circuits 301 may include an A/D converter. When image data is output to the outside from the pixel blocks 200 with or without undergoing an arithmetic operation, the analog data can be converted into digital data by the circuits 301.

For example, in the pixel block 200 including 3×3 pixels 100, when the same weight (e.g., 0) is supplied to all the pixels 100 and the transistor 108 included in the pixel from which data is to be output is turned on, the sum of image data of the whole pixel block 200, the row-basis sum of image data, data from each pixel, or the like can be output from the pixel block 200.

In the case where the data output from the pixel blocks 200, which corresponds to image data of a plurality of bits, can be binarized by the circuits 301, the binarization can be rephrased as compression of image data.

Data output from the circuits 301 is sequentially input to the circuit 302. The circuit 302 can have a structure including a latch circuit, a shift register, and the like, for example. With this structure, parallel-serial conversion can be performed and data input in parallel can be output to the wiring 311 as serial data.

Figure 20B:
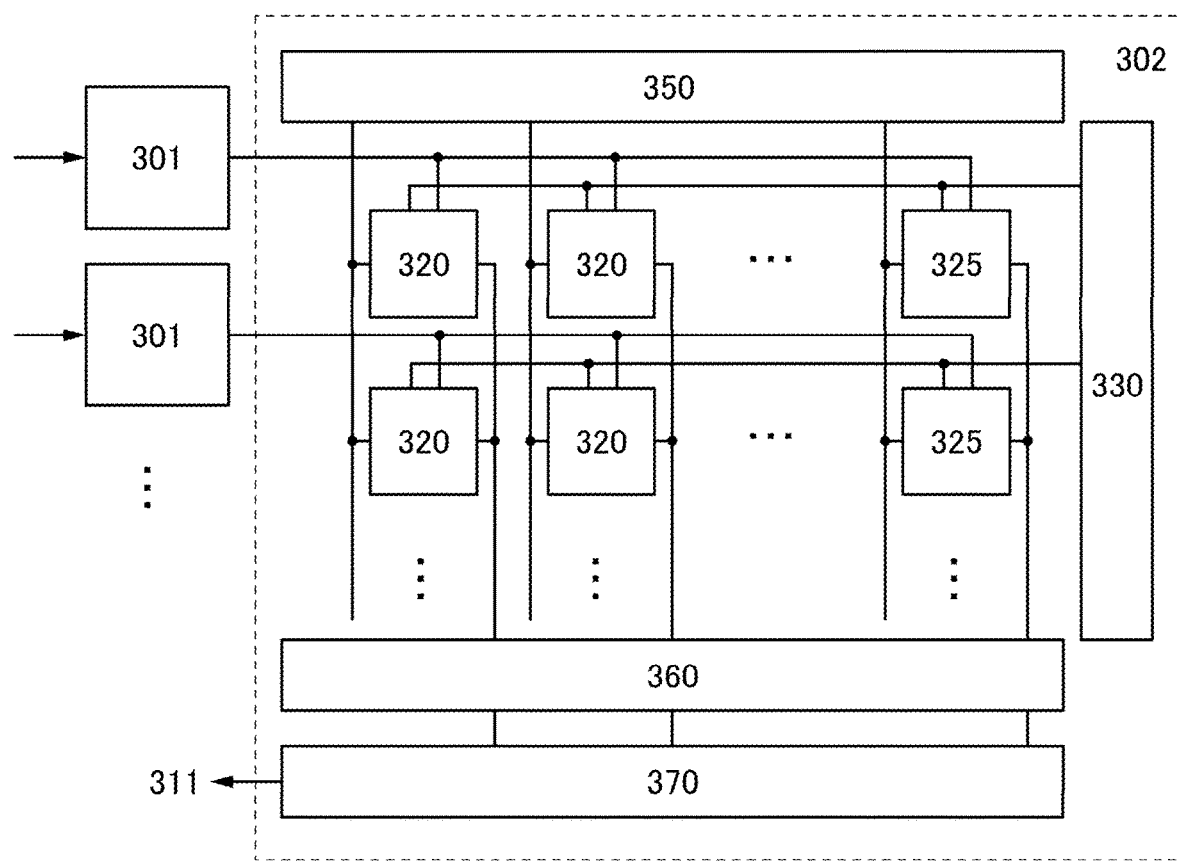

Moreover, as illustrated in FIG. 20B, the circuit 302 may include a neural network. The neural network includes memory cells arranged in a matrix, and each memory cell retains a weight coefficient. Data output from the circuits 301 is input to corresponding memory cells 320, and a product-sum operation can be performed. Note that the number of memory cells illustrated in FIG. 20B is an example, and the number is not limited thereto. Data after the product-sum operation can be output to the wiring 311.

Note that the connection destination of the wiring 311 is not limited in FIG. 20A and FIG. 20B. For example, the wiring 311 can be connected to a neural network, a memory device, a communication device, or the like.

The neural network illustrated in FIG. 20B includes memory cells 320 and reference memory cells 325 which are arranged in a matrix, a circuit 330, a circuit 350, a circuit 360, and a circuit 370.

Figure 21:
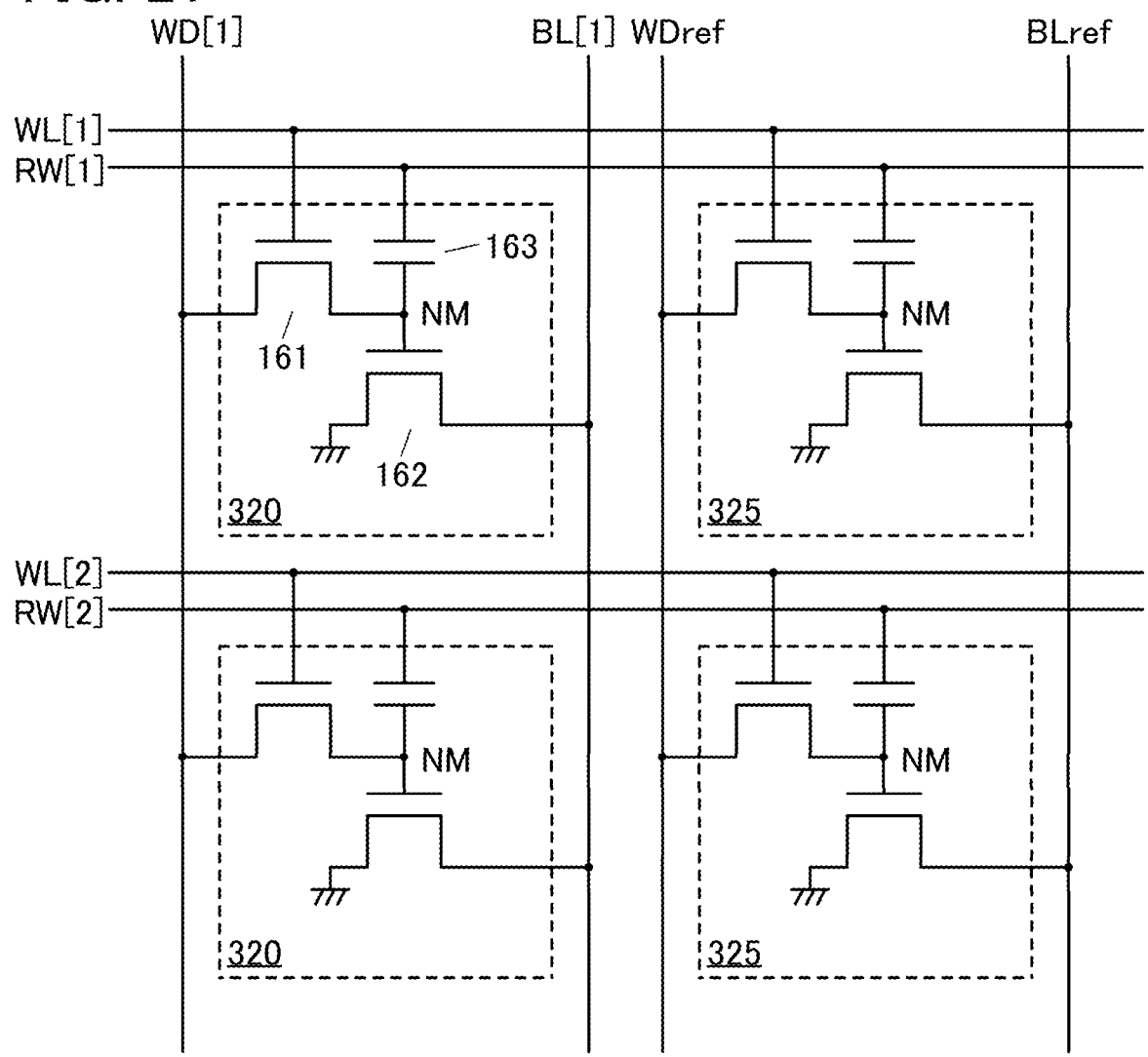
FIG. 21 is a diagram illustrating memory cells.

FIG. 21 illustrates an example of the memory cells 320 and the reference memory cells 325. The reference memory cells 325 are provided in any one column. The memory cells 320 and the reference memory cells 325 have similar structures and each include a transistor 161, a transistor 162, and a capacitor 163.

One of a source and a drain of the transistor 161 is electrically connected to a gate of the transistor 162. The gate of the transistor 162 is electrically connected to one electrode of the capacitor 163. Here, a point at which the one of the source and the drain of the transistor 161, the gate of the transistor 162, and the one electrode of the capacitor 163 are connected is referred to as a node NM.

A gate of the transistor 161 is electrically connected to a wiring WL. The other electrode of the capacitor 163 is electrically connected to a wiring RW. One of a source and a drain of the transistor 162 is electrically connected to a reference potential wiring such as a GND wiring.

In the memory cell 320, the other of the source and the drain of the transistor 161 is electrically connected to a wiring WD. The other of the source and the drain of the transistor 162 is electrically connected to a wiring BL.

In the reference memory cell 325, the other of the source and the drain of the transistor 161 is electrically connected to a wiring WDref. The other of the source and the drain of the transistor 162 is electrically connected to a wiring BLref.

The wiring WL is electrically connected to a circuit 330. As the circuit 330, a decoder, a shift register, or the like can be used.

The wiring RW is electrically connected to the circuit 301. Binary data output from the circuit 301 is written to each memory cell. Note that a sequential circuit such as a shift register may be provided between the circuit 301 and the memory cells.

The wiring WD and the wiring WDref are electrically connected to the circuit 350. As the circuit 350, a decoder, a shift register, or the like can be used. Furthermore, the circuit 350 may include a D/A converter, an SRAM, or the like. The circuit 350 can output a weight coefficient to be written to the node NM.

The wiring BL and the wiring BLref are electrically connected to the circuit 360. The circuit 360 can have a structure equivalent to that of the circuit 201. By the circuit 360, a signal of a product-sum operation result from which offset components are eliminated can be obtained.

The circuit 360 is electrically connected to the circuit 370. The circuit 370 can also be referred to as an activation function circuit. The activation function circuit has a function of performing an arithmetic operation for converting the signal input from the circuit 360 in accordance with a predefined activation function. As the activation function, for example, a sigmoid function, a tanh function, a softmax function, a ReLU function, a threshold function, or the like can be used. The signal converted by the activation function circuit is output to the outside as output data.

Figure 22A:
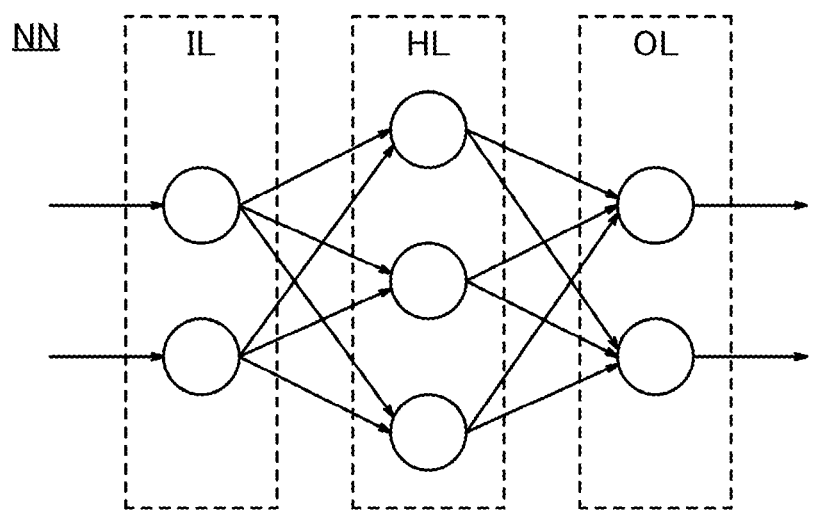
FIG. 22A and FIG. 22B are diagrams illustrating a structure example of a neural network.

As illustrated in FIG. 22A, a neural network NN can be formed of an input layer IL, an output layer OL, and a middle layer (hidden layer) HL. The input layer IL, the output layer OL, and the middle layer HL each include one or more neurons (units). Note that the middle layer HL may be composed of one layer or two or more layers. A neural network including two or more middle layers HL can also be referred to as a DNN (deep neural network). Learning using a deep neural network can also be referred to as deep learning.

Input data is input to each neuron in the input layer IL. An output signal of a neuron in the previous layer or the subsequent layer is input to each neuron in the middle layer HL. To each neuron in the output layer OL, output signals of the neurons in the previous layer are input. Note that each neuron may be connected to all the neurons in the previous and subsequent layers (full connection), or may be connected to some of the neurons.

Figure 22B:
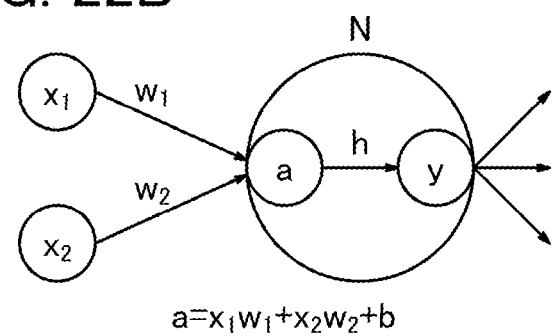

FIG. 22B shows an example of an arithmetic operation with the neurons. Here, a neuron N and two neurons in the previous layer which output signals to the neuron N are illustrated. An output $x_1$ of a neuron in the previous layer and an output $x_2$ of a neuron in the previous layer are input to the neuron N. Then, in the neuron N, a total sum $x_1w_1+x_2w_2$ of a multiplication result $(x_1w_1)$ of the output $x_1$ and a weight $w_1$ and a multiplication result $(x_2w_2)$ of the output $x_2$ and a weight $w_2$ is calculated, and then a bias b is added as necessary, so that the value $a=x_1w_1+x_2w_2+b$ is obtained. Then, the value a is converted with an activation function h, and an output signal y=ah is output from the neuron N.

In this manner, the arithmetic operation with the neurons includes the arithmetic operation that sums the products of the outputs and the weights of the neurons in the previous layer, that is, the product-sum operation $(x_1w_1+x_2w_2$ described above). This product-sum operation may be performed using a program on software or may be performed using hardware.

In one embodiment of the present invention, an analog circuit is used as hardware to perform a product-sum operation. In the case where an analog circuit is used as the product-sum operation circuit, the circuit scale of the product-sum operation circuit can be reduced, or higher processing speed and lower power consumption can be achieved by reduced frequency of access to a memory.

The product-sum operation circuit preferably has a structure including an OS transistor. An OS transistor is suitably used as a transistor included in an analog memory of the product-sum operation circuit because of its extremely low off-state current. Note that the product-sum operation circuit may be formed using both a Si transistor and an OS transistor.

At least part of this embodiment can be implemented in appropriate combination with the other embodiments described in this specification.

Embodiment 3

In this embodiment, a transistor that can be used in the imaging device of one embodiment of the present invention is described. In particular, a transistor including an oxide semiconductor (OS transistor) is described here.

As a semiconductor material used for an OS transistor, a metal oxide whose energy gap is greater than or equal to 2 eV, preferably greater than or equal to 2.5 eV, further preferably greater than or equal to 3 eV can be used. A typical example is an oxide semiconductor containing indium, and a CAAC-OS or a CAC-OS, each of which will be described later, or the like can be used, for example. A CAAC-OS has a crystal structure including stable atoms and is suitable for a transistor that is required to have high reliability, and the like. A CAC-OS has high mobility and is suitable for a transistor that operates at high speed, and the like.

In an OS transistor, a semiconductor layer has a large energy gap, and thus the OS transistor has an extremely low off-state current of several yoctoamperes per micrometer (current per micrometer of a channel width). An OS transistor has features such that impact ionization, an avalanche breakdown, a short-channel effect, and the like do not occur, which are different from those of a Si transistor. Hence, the use of an OS transistor enables formation of a circuit having high withstand voltage and high reliability. Moreover, variations in electrical characteristics due to crystallinity unevenness, which are caused in Si transistors, are less likely to occur in OS transistors.

A semiconductor layer included in an OS transistor can be, for example, a film represented by an In-M-Zn-based oxide that contains indium, zinc, and M (M is one or more selected from metals such as aluminum, titanium, gallium, germanium, yttrium, zirconium, lanthanum, cerium, tin, neodymium, and hafnium). The In-M-Zn-based oxide can be formed by, for example, a sputtering method, an ALD (Atomic layer deposition) method, or an MOCVD (Metal organic chemical vapor deposition) method.

In the case where the In-M-Zn-based oxide is deposited by a sputtering method, it is preferable that the atomic ratio of the metal elements in a sputtering target satisfy In ≥M and Zn≥M. The atomic ratio of the metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:3, In:M:Zn=5:1:6, In:M:Zn=5:1:7, In:M:Zn=5:1:8, or In:M:Zn=10:1:3. Note that the atomic ratio in the formed semiconductor layer varies from the above atomic ratio of the metal elements of the sputtering target in a range of ±40%.

An oxide semiconductor with a low carrier density is used for the semiconductor layer. For example, for the semiconductor layer, it is possible to use an oxide semiconductor whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$. Such an oxide semiconductor is referred to as a highly purified intrinsic or substantially highly purified intrinsic oxide semiconductor. The oxide semiconductor has a low density of defect states and can thus be referred to as an oxide semiconductor having stable characteristics.

Note that the composition is not limited to those described above, and an oxide semiconductor having an appropriate composition can be used depending on required semiconductor characteristics and electrical characteristics (e.g., field-effect mobility and threshold voltage) of the transistor. To obtain the required semiconductor characteristics of the transistor, it is preferable that the carrier density, the impurity concentration, the defect density, the atomic ratio between metal elements and oxygen, the interatomic distance, the density, or the like of the semiconductor layer be set to appropriate values.

When silicon, carbon, or the like, which is one of elements belonging to Group 14, is contained in the oxide semiconductor contained in the semiconductor layer, oxygen vacancies are increased, and the semiconductor layer becomes n-type. Thus, the concentration of silicon, carbon, or the like (the concentration obtained by secondary ion mass spectrometry) in the semiconductor layer is set lower than or equal to $2\times10^{18}$ atoms/cm$^3$, preferably lower than or equal to $2\times10^{17}$ atoms/cm$^3$.

Alkali metal and alkaline earth metal might generate carriers when bonded to an oxide semiconductor, in which case the off-state current of the transistor might be increased. Therefore, the concentration of alkali metal or alkaline earth metal (the concentration obtained by secondary ion mass spectrometry) in the semiconductor layer is set lower than or equal to $1\times10^{18}$ atoms/cm$^3$, preferably lower than or equal to $2\times10^{16}$ atoms/cm$^3$.

When nitrogen is contained in the oxide semiconductor contained in the semiconductor layer, electrons serving as carriers are generated and the carrier density increases, so that the semiconductor layer easily becomes n-type. As a result, a transistor using an oxide semiconductor that contains nitrogen is likely to have normally-on characteristics. Hence, the nitrogen concentration (the concentration obtained by secondary ion mass spectrometry) in the semiconductor layer is preferably set lower than or equal to $5\times10^{18}$ atoms/cm$^3$.

When hydrogen is contained in the oxide semiconductor contained in the semiconductor layer, hydrogen reacts with oxygen bonded to a metal atom to be water, and thus sometimes forms oxygen vacancies in the oxide semiconductor. If the channel formation region in the oxide semiconductor includes oxygen vacancies, the transistor sometimes has normally-on characteristics. In some cases, a defect that is an oxygen vacancy into which hydrogen has entered functions as a donor and generates an electron serving as a carrier. In other cases, bonding of part of hydrogen to oxygen bonded to a metal atom generates electrons serving as carriers. Thus, a transistor using an oxide semiconductor that contains a large amount of hydrogen is likely to have normally-on characteristics.

A defect in which hydrogen enters oxygen vacancies can function as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration in the oxide semiconductor, which is obtained by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When an oxide semiconductor with sufficiently reduced impurities such as hydrogen is used for a channel formation region of a transistor, the transistor can have stable electrical characteristics.

The semiconductor layer may have a non-single-crystal structure, for example. Examples of the non-single-crystal structure include a CAAC-OS (C-Axis Aligned Crystalline Oxide Semiconductor) including a c-axis aligned crystal, a polycrystalline structure, a microcrystalline structure, and an amorphous structure. Among the non-single-crystal structures, the amorphous structure has the highest density of defect states, whereas the CAAC-OS has the lowest density of defect states.

An oxide semiconductor film having an amorphous structure has disordered atomic arrangement and no crystalline component, for example. Alternatively, an oxide film having an amorphous structure has, for example, a completely amorphous structure and no crystal part.

Note that the semiconductor layer may be a mixed film including two or more of a region having an amorphous structure, a region having a microcrystalline structure, a region having a polycrystalline structure, a CAAC-OS region, and a region having a single crystal structure. The mixed film has, for example, a single-layer structure or a stacked-layer structure including two or more of the above-described regions in some cases.

The composition of a CAC (Cloud-Aligned Composite)-OS, which is one embodiment of a non-single-crystal semiconductor layer, is described below.

A CAC-OS refers to one composition of a material in which elements constituting an oxide semiconductor are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 2 nm, or a similar size in an oxide semiconductor is hereinafter referred to as a mosaic pattern or a patch-like pattern.

Note that an oxide semiconductor preferably contains at least indium. In particular, indium and zinc are preferably contained. In addition, one or more kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, a CAC-OS in an In—Ga—Zn oxide (of the CAC-OS, an In—Ga—Zn oxide may be particularly referred to as CAC-IGZO) has a composition in which materials are separated into indium oxide (hereinafter InO$_{X1}$, where X1 is a real number greater than 0) or indium zinc oxide (hereinafter In$_{X2}$Zn$_{Y2}$O$_{Z2}$, where X2, Y2, and Z2 are real numbers greater than 0), and gallium oxide (hereinafter GaO$_{X3}$, where X3 is a real number greater than 0) or gallium zinc oxide (hereinafter Ga$_{X4}$Zn$_{Y4}$O$_{Z4}$, where X4, Y4, and Z4 are real numbers greater than 0), for instance, to form a mosaic pattern, and InO$_{X1}$ or In$_{X2}$Zn$_{Y2}$O$_{Z2}$ forming the mosaic pattern is evenly distributed in the film. This composition is also referred to as a cloud-like composition.

That is, the CAC-OS is a composite oxide semiconductor having a composition in which a region including GaO$_{X3}$ as a main component and a region including In$_{X2}$Zn$_{Y2}$O$_{Z2}$ or InO$_{X1}$ as a main component are mixed. Note that in this specification, for example, when the atomic ratio of In to the element M in a first region is greater than the atomic ratio of In to the element M in a second region, the first region is regarded as having a higher In concentration than the second region.

Note that IGZO is a common name, which may specify a compound containing In, Ga, Zn, and O. A typical example is a crystalline compound represented by InGaO$_3$(ZnO)$_{m1}$ (m1 is a natural number) or In$_{(1+x0)}$Ga$_{(1-x0)}$O$_3$(ZnO)$_{m0}$ ($-1\leq x0\leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. The CAC-OS refers to a composition in which, in the material composition containing In, Ga, Zn, and O, some regions that contain Ga as a main component and are observed as nanoparticles and some regions that contain In as a main component and are observed as nanoparticles are randomly dispersed in a mosaic pattern. Therefore, the crystal structure is a secondary element for the CAC-OS.

Note that in the CAC-OS, a stacked-layer structure including two or more films with different compositions is not included. For example, a two-layer structure of a film containing In as a main component and a film containing Ga as a main component is not included.

A boundary between the region containing GaO$_{X3}$ as a main component and the region containing In$_{X2}$Zn$_{Y2}$O$_{Z2}$ or InO$_{X1}$ as a main component is not clearly observed in some cases.

In the case where one or more kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, nanoparticle regions containing the selected metal element(s) as a main component are observed in part of a CAC-OS and nanoparticle regions containing In as a main component are observed in part of the CAC-OS, and these nanoparticle regions are randomly dispersed to form a mosaic pattern.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. The ratio of the flow rate of the oxygen gas to the total flow rate of the deposition gas in deposition is preferably as low as possible, and for example, the ratio of the flow rate of the oxygen gas is higher than or equal to 0% and lower than 30%, preferably higher than or equal to 0% and lower than or equal to 10%.

The CAC-OS is characterized in that a clear peak is not observed when measurement is conducted using a θ/2θ scan by an Out-of-plane method, which is an X-ray diffraction (XRD) measurement method. That is, it is found from X-ray diffraction measurement that no alignment in the a-b plane direction and the c-axis direction is observed in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. It is therefore found from the electron diffraction pattern that the crystal structure of the CAC-OS includes an nc (nano-crystal) structure with no alignment in the plan-view direction and the cross-sectional direction.

Moreover, for example, it can be confirmed by EDX mapping obtained using energy dispersive X-ray spectroscopy (EDX) that the CAC-OS in the In—Ga—Zn oxide has a composition in which regions including $GaO_{X3}$ as a main component and regions including $In_{X2}Zn_{Y2}O_{Z2}$ or $InO_{X1}$ as a main component are unevenly distributed and mixed.

The CAC-OS has a composition different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are phase-separated from each other to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through the regions including $In_{X2}Zn_{Y2}O_{Z2}$ or $InO_{X1}$ as a main component, the conductivity of an oxide semiconductor is exhibited. Accordingly, when the regions including $In_{X2}Zn_{Y2}O_{Z2}$ or $InO_{X1}$ as a main component are distributed in an oxide semiconductor like a cloud, high field-effect mobility ($\mu$) can be achieved.

By contrast, the insulating property of a region including $GaO_{X3}$ or the like as a main component is higher than that of a region including $In_{X2}Zn_{Y2}O_{Z2}$ or $InO_{X1}$ as a main component. In other words, when the regions including $GaO_{X3}$ or the like as a main component are distributed in an oxide semiconductor, a leakage current can be suppressed and a favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$) and high field-effect mobility ($\mu$) can be achieved.

A semiconductor element using a CAC-OS has high reliability. Thus, the CAC-OS is suitably used as a constituent material of a variety of semiconductor devices.

Embodiment 4

In this embodiment, a package and a module each including the imaging device of one embodiment of the present invention are described.

FIG. 23A1 is an external perspective view of the top surface side of a package in which an image sensor chip is placed. The package includes a package substrate 410 to which an image sensor chip 450 (see FIG. 23A3) is fixed, a cover glass 420, an adhesive 430 for bonding them, and the like.

FIG. 23A2 is an external perspective view of the bottom surface side of the package. A BGA (Ball grid array) in which solder balls are used as bumps 440 is included on the bottom surface of the package. Note that, without being limited to the BGA, an LGA (Land grid array), a PGA (Pin Grid Array), or the like may be employed.

FIG. 23A3 is a perspective view of the package, in which parts of the cover glass 420 and the adhesive 430 are not illustrated. Electrode pads 460 are formed over the package substrate 410, and the electrode pads 460 and the above-described bumps 440 are electrically connected to each other via through-holes. The electrode pads 460 are electrically connected to the image sensor chip 450 through wires 470.

FIG. 23B1 is an external perspective view of the top surface side of a camera module in which an image sensor chip is placed in a package with a built-in lens. The camera module includes a package substrate 411 to which an image sensor chip 451 (see FIG. 23B3) is fixed, a lens cover 421, a lens 435, and the like. Furthermore, an IC chip 490 (see FIG. 23B3) having functions of a driver circuit, a signal conversion circuit, and the like of the imaging device is provided between the package substrate 411 and the image sensor chip 451; thus, the structure as an SiP (System in package) is included.

FIG. 23B2 is an external perspective view of the bottom surface side of the camera module. A QFN (Quad flat no-lead package) structure in which lands 441 for mounting are provided on the bottom surface and side surfaces of the package substrate 411 is employed. Note that this structure is only an example, and a QFP (Quad flat package) or the above-mentioned BGA may also be provided.

FIG. 23B3 is a perspective view of the module, in which parts of the lens cover 421 and the lens 435 are not illustrated. The lands 441 are electrically connected to electrode pads 461, and the electrode pads 461 are electrically connected to the image sensor chip 451 or the IC chip 490 through wires 471.

The image sensor chip placed in a package having the above form can be easily mounted on a printed substrate or the like, and the image sensor chip can be incorporated in a variety of semiconductor devices and electronic devices.

Embodiment 5

As electronic devices that can use the imaging device of one embodiment of the present invention, display devices, personal computers, image memory devices or image reproducing devices provided with storage media, mobile phones, game machines including portable game machines, portable data terminals, e-book readers, cameras such as video cameras and digital still cameras, goggle-type displays (head mounted displays), navigation systems, audio reproducing devices (car audio players, digital audio players, and the like), copiers, facsimiles, printers, multifunction printers, automated teller machines (ATM), vending machines, and the like are given. FIG. 24A to FIG. 24F illustrate specific examples of these electronic devices.

Figure 24A:
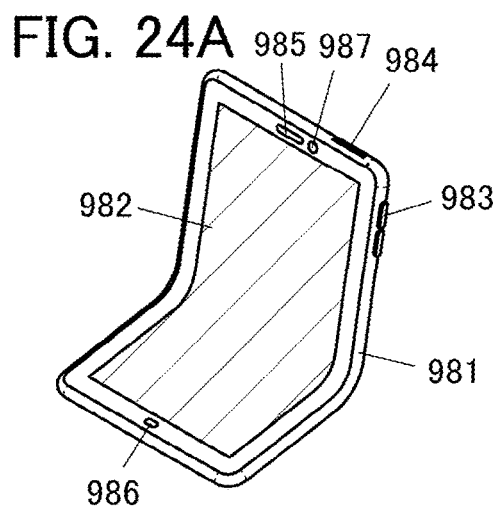
FIG. 24A to FIG. 24F are diagrams illustrating electronic devices.

FIG. 24A is an example of a mobile phone, which includes a housing 981, a display portion 982, an operation button 983, an external connection port 984, a speaker 985, a microphone 986, a camera 987, and the like. The display portion 982 of the mobile phone is provided with a touch sensor. A variety of operations such as making a call and inputting text can be performed by touch on the display portion 982 with a finger, a stylus, or the like. The imaging device of one embodiment of the present invention and the operation method thereof can be used in the mobile phone, enabling an infrared light image as well as a color image to be obtained.

Figure 24B:
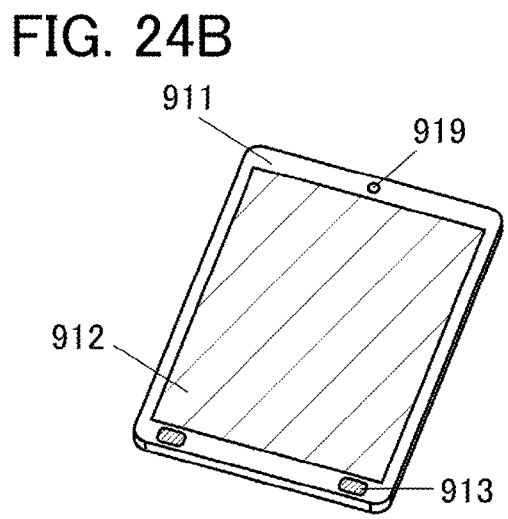

FIG. 24B is a portable data terminal, which includes a housing 911, a display portion 912, a speaker 913, a camera 919, and the like. A touch panel function of the display portion 912 enables input and output of information. Furthermore, a character or the like in an image that is captured by the camera 919 can be recognized and the character can be voice-output from the speaker 913. The imaging device of one embodiment of the present invention and the operation method thereof can be used in the portable data terminal, enabling an infrared light image as well as a color image to be obtained.

Figure 24C:
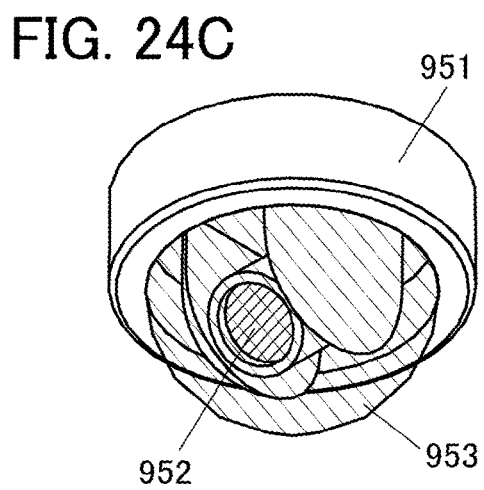

FIG. 24C is a surveillance camera, which includes a support base 951, a camera unit 952, a protection cover 953, and the like. By setting the camera unit 952 provided with a rotating mechanism and the like on a ceiling, an image of all of the surroundings can be taken. The imaging device of one embodiment of the present invention and the operation method thereof can be used for obtaining an image in the camera unit, enabling an infrared light image as well as a color image to be obtained. Note that a surveillance camera is a name in common use and does not limit the use thereof. A device that has a function of a surveillance camera can also be called a camera or a video camera, for example.

Figure 24D:
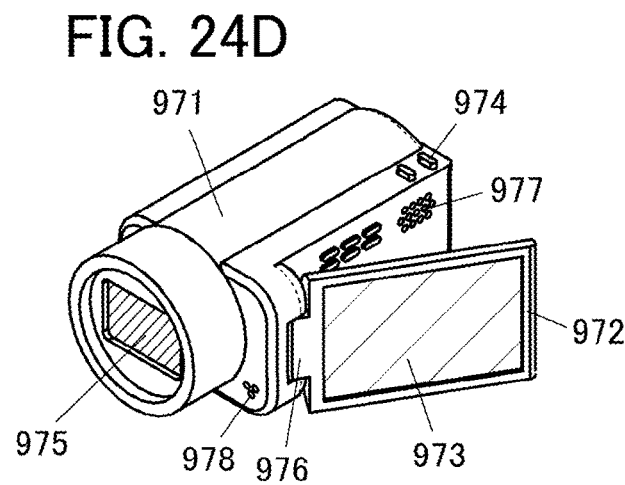

FIG. 24D is a video camera, which includes a first housing 971, a second housing 972, a display portion 973, an operation key 974, a lens 975, a connection portion 976, a speaker 977, a microphone 978, and the like. The operation key 974 and the lens 975 are provided for the first housing 971, and the display portion 973 is provided for the second housing 972. The imaging device of one embodiment of the present invention and the operation method thereof can be used in the video camera, enabling an infrared light image as well as a color image to be obtained.

Figure 24E:
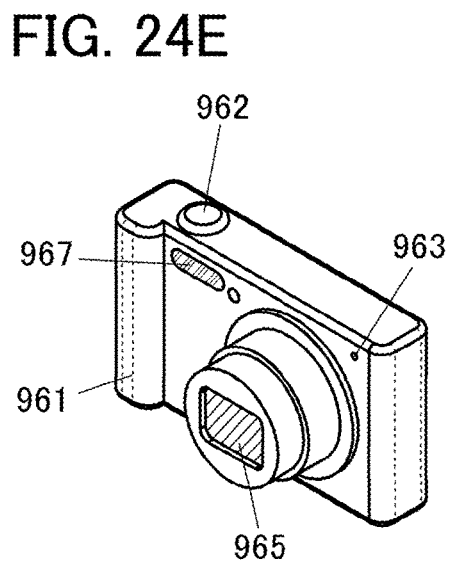

FIG. 24E is a digital camera, which includes a housing 961, a shutter button 962, a microphone 963, a light-emitting portion 967, a lens 965, and the like. The imaging device of one embodiment of the present invention and the operation method thereof can be used in the digital camera, enabling an infrared light image as well as a color image to be obtained.

Figure 24F:
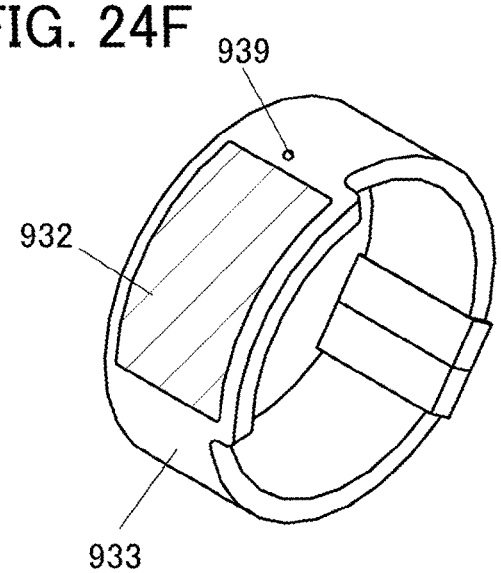

FIG. 24F is a wrist-watch-type information terminal, which includes a display portion 932, a housing and wristband 933, a camera 939, and the like. The display portion 932 is provided with a touch panel for performing the operation of the information terminal. The display portion 932 and the housing and wristband 933 have flexibility and fit a body well. The imaging device of one embodiment of the present invention and the operation method thereof can be used in the information terminal, enabling an infrared light image as well as a color image to be obtained.

Figure 25A:
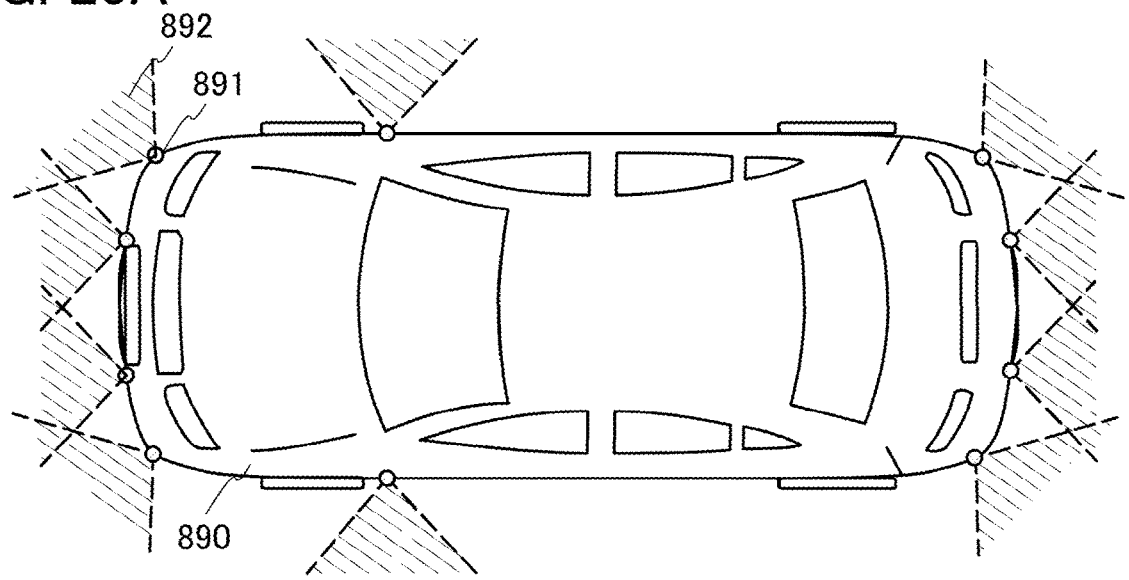
FIG. 25A and FIG. 25B are diagrams illustrating a moving object.
Figure 25B:
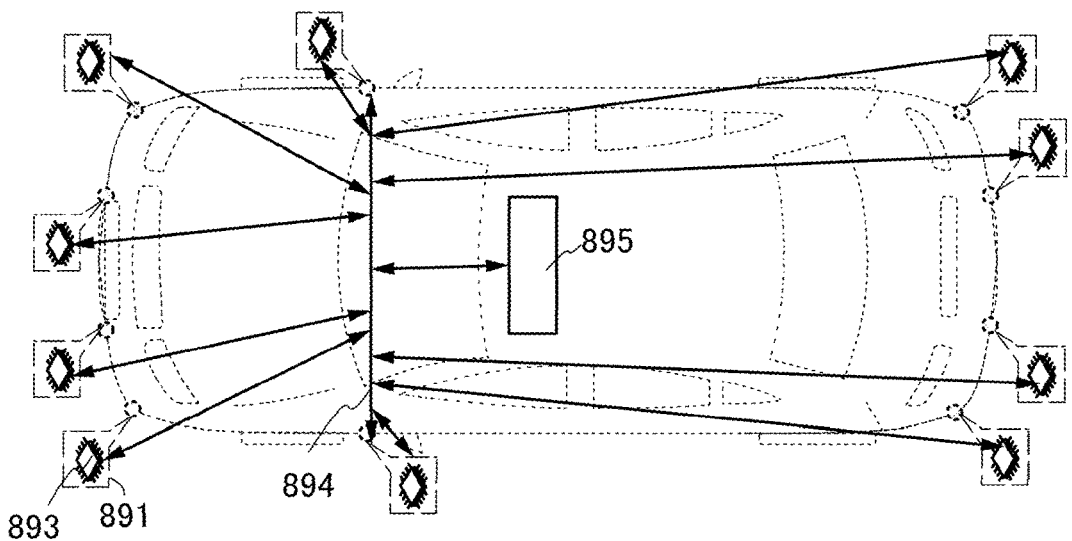

FIG. 25A illustrates an external view of an automobile as an example of a moving object. FIG. 25B is a simplified diagram illustrating data transmission in the automobile. An automobile 890 includes a plurality of cameras 891 and the like. The imaging device of one embodiment of the present invention can be used in the cameras 891. The automobile 890 is also provided with various sensors such as an infrared radar, a millimeter wave radar, and a laser radar (not illustrated) and the like.

In the automobile 890, integrated circuits 893 can be used for the cameras 891 and the like. The automobile 890 judges traffic conditions therearound such as the presence of a guardrail or a pedestrian by processing a plurality of images in a plurality of image capturing directions 892 taken by the cameras 891 with the integrated circuits 893 and collectively analyzing the plurality of images with a host controller 895 or the like through a bus 894 or the like, and thus can perform autonomous driving. Furthermore, it can be used in a system for navigation, risk prediction, or the like.

When arithmetic processing with a neural network or the like is performed on the obtained image data in the automobile 890, for example, processing such as an increase in image resolution, a reduction in image noise, face recognition (for security reasons or the like), object recognition (for autonomous driving or the like), image compression, image compensation (a wide dynamic range), restoration of an image of a lensless image sensor, positioning, character recognition, and reduction of glare and reflection can be performed.

Note that an automobile is described above as an example of a movable object and may be any of an automobile having an internal-combustion engine, an electric vehicle, a hydrogen vehicle, and the like. Furthermore, the movable object is not limited to an automobile. Examples of movable objects include a train, a monorail train, a ship, and a flying object (a helicopter, an unmanned aircraft (a drone), an airplane, and a rocket), and these movable objects can include a system utilizing artificial intelligence when equipped with the computer of one embodiment of the present invention.

Figure 25C:
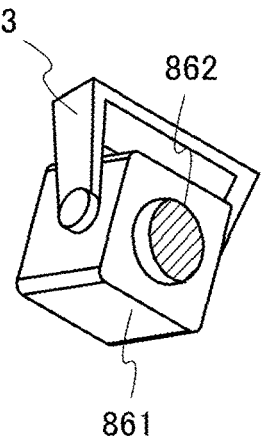
FIG. 25C is a diagram illustrating an electronic device.

FIG. 25C illustrates an external view of an in-vehicle imaging camera.

The imaging camera in FIG. 25C can also be referred to as a dashboard camera. The imaging camera illustrated in FIG. 25C includes a housing 861, a lens 862, a support portion 863, and the like. When a double-sided tape or the like is attached to the support portion 863, the imaging camera can be placed on the windshield, the hood, a rear-view mirror support, or the like of the automobile or the like. Note that the shape and size of the support portion 863, the housing 861, and the lens are not limited to those in the structure of FIG. 25C and can be changed as appropriate in accordance with the position where they are placed.

The imaging device of one embodiment of the present invention can be used inside the imaging camera of FIG. 25C. Furthermore, driving video can be recorded and stored in the imaging camera or an in-vehicle memory device.

At least part of this embodiment can be implemented in appropriate combination with the other embodiments described in this specification.

REFERENCE NUMERALS

10: imaging device: 11a, 11b, 11, 12: functional layer: 13B, 13G, 13IR, 13R: plugs: 14, 15: insulating layers: 16a, 16b: opening portion: 17: insulating layer: 18: microlens array: 20B, 20G, 20IR, 20R, 20UV: light-receiving elements: 21a: buffer layer: 21b: active layer: 21c: buffer layer: 21B, 21G, 21IR, 21R: photoelectric conversion layers: 22, 23, 24: conductive layers: 31, 32: transistors: 40: light-receiving element: 41, 42, 43: regions: 51: silicon substrate: 52, 53: insulating layers: 54: semiconductor layer: 55, 56: silicon substrates: 57: insulating layer: 61a, 61b, 62a, 62b, 63a, 63b, 64a, 64b, 65a, 65b: transistors: 71: gate electrode: 72: gate insulating layer: 73: source region: 74: drain region: 75: source electrode: 76: drain electrode: 77: semiconductor layer: 78: backgate: 81: plug: 82, 83: insulating layers: 84, 85: plugs: 86: insulating layer

The invention claimed is:

1. An imaging device comprising a first light-receiving element, a second light-receiving element, a third light-receiving element, a fourth light-receiving element, a first functional layer, and a second functional layer,
wherein the first light-receiving element is a photoelectric conversion element having sensitivity to light of a first wavelength, wherein the second light-receiving element is a photoelectric conversion element having sensitivity to light of a second wavelength, wherein the third light-receiving element is a photoelectric conversion element having sensitivity to light of a third wavelength, wherein the fourth light-receiving element is a photoelectric conversion element having sensitivity to light of a fourth wavelength, wherein the first functional layer comprises a first transistor, wherein the second functional layer comprises a second transistor, wherein the first functional layer, the fourth light-receiving element, the third light-receiving element, the second light-receiving element, and the first light-receiving element are stacked in this order over the second functional layer, wherein each of the first light-receiving element, the second light-receiving element, the third light-receiving element, and the fourth light-receiving element has a stacked-layer structure in which a first conductive layer, a first buffer layer, a photoelectric conversion layer, a second buffer layer, and a second conductive layer are stacked in this order, wherein the photoelectric conversion layer comprises an organic compound, wherein each of the first buffer layer and the second buffer layer comprises a metal or an organic compound, wherein the first transistor is electrically connected to the first conductive layer included in any one of the first light-receiving element, the second light-receiving element, the third light-receiving element, and the fourth light-receiving element, and wherein the second transistor is electrically connected to the first transistor.

2. An imaging device comprising a first light-receiving element, a second light-receiving element, a third light-receiving element, a fourth light-receiving element, a first functional layer, and a second functional layer, wherein the first light-receiving element is a photoelectric conversion element having sensitivity to light of a first wavelength, wherein the second light-receiving element is a photoelectric conversion element having sensitivity to light of a second wavelength, wherein the third light-receiving element is a photoelectric conversion element having sensitivity to light of a third wavelength, wherein the fourth light-receiving element is a photoelectric conversion element having sensitivity to light of a fourth wavelength, wherein the first functional layer comprises a first transistor, wherein the second functional layer comprises a second transistor, wherein the first functional layer, the fourth light-receiving element, the third light-receiving element, the second light-receiving element, and the first light-receiving element are stacked in this order over the second functional layer, wherein each of the first light-receiving element, the second light-receiving element, and the third light-receiving element has a stacked-layer structure in which a first conductive layer, a first buffer layer, a photoelectric conversion layer, a second buffer layer, and a second conductive layer are stacked in this order, wherein the photoelectric conversion layer comprises an organic compound, wherein each of the first buffer layer and the second buffer layer comprises a metal or an organic compound, wherein the fourth light-receiving element is provided on a first single crystal substrate and comprises a photoelectric conversion portion having a pn junction in the first single crystal substrate, wherein the first transistor is electrically connected to the first conductive layer included in any one of the first light-receiving element, the second light-receiving element, and the third light-receiving element, and wherein the second transistor is electrically connected to the first transistor.

3. The imaging device according to claim 2, wherein the first transistor is provided on the first single crystal substrate and comprises a channel formation region in the first single crystal substrate.

4. The imaging device according to claim 1, wherein the first transistor comprises silicon in a channel formation region.

5. The imaging device according to claim 1, wherein the first transistor comprises an oxide semiconductor in a channel formation region.

6. The imaging device according to claim 2, wherein the second transistor is provided on the first single crystal substrate and comprises a channel formation region in the first single crystal substrate.

7. The imaging device according to claim 6, further comprising a third functional layer between the first functional layer and the second functional layer, wherein the third functional layer comprises a third transistor, and wherein the third transistor comprises an oxide semiconductor in a channel formation region.

8. The imaging device according to claim 1, further comprising a plug, wherein the plug electrically connects one of a source and a drain of the first transistor and the first conductive layer included in the first light-receiving element to each other, wherein the photoelectric conversion layer included in the second light-receiving element comprises a first opening portion, wherein the second conductive layer included in the second light-receiving element comprises a second opening portion, wherein the plug comprises a portion that is in contact with the photoelectric conversion layer in the first opening portion, and wherein the plug comprises a portion positioned inside the second opening portion and is in contact with neither the first conductive layer nor the second conductive layer included in the second light-receiving element.

9. The imaging device according to claim 1, further comprising a plug, wherein the plug electrically connects one of a source and a drain of the first transistor and the first conductive layer included in the first light-receiving element to each other, wherein the photoelectric conversion layer included in the second light-receiving element comprises a first opening portion, wherein the second conductive layer included in the second light-receiving element comprises a second opening portion, and wherein the plug comprises a portion positioned inside the first opening portion and a portion positioned inside the second opening portion and is in contact with neither the first conductive layer, the photoelectric conversion layer, nor the second conductive layer included in the second light-receiving element.

10. The imaging device according to claim 1, wherein any three of the light of the first wavelength, the light of the second wavelength, the light of the third wavelength, and the light of the fourth wavelength are visible light and the other is infrared light or ultraviolet light.

11. The imaging device according to claim 1, wherein wavelengths are shorter in the order of the first wavelength, the second wavelength, the third wavelength, and the fourth wavelength.

12. The imaging device according to claim 1, wherein the second transistor is provided on a first single crystal substrate and comprises a channel formation region in the first single crystal substrate.

\* \* \* \* \*